(12) United States Patent
Kono et al.

(10) Patent No.: US 6,717,887 B1
(45) Date of Patent: Apr. 6, 2004

(54) SEMICONDUCTOR MEMORY DEVICE HAVING CONFIGURATION FOR SELECTING DESIRED DELAY LOCKED LOOP CLOCK

(75) Inventors: Takashi Kono, Hyogo (JP); Kiyohiro Furutani, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/438,928

(22) Filed: May 16, 2003

(30) Foreign Application Priority Data

Nov. 14, 2002 (JP) ........................................ 2002-330603

(51) Int. Cl.$^7$ ................................................ G11C 8/00
(52) U.S. Cl. .................. 365/233; 365/194; 365/189.01; 365/76; 327/141; 327/153
(58) Field of Search ................................ 365/233, 194, 365/189.01, 76; 327/141, 153

(56) References Cited

U.S. PATENT DOCUMENTS 5,844,859 A * 12/1998 Iwamoto et al. ............ 365/233
5,940,344 A * 8/1999 Murai et al. ................. 365/233
5,963,502 A * 10/1999 Watanabe et al. ........... 365/233

FOREIGN PATENT DOCUMENTS

JP          11-353878          12/1999

* cited by examiner

*Primary Examiner*—Connie C. Yoha
(74) *Attorney, Agent, or Firm*—McDermott, Will & Emery

(57) ABSTRACT

A frequency divider divides a frequency of a DLL clock CLK_P into two, to generate ZCLK_PD0 and ZCLK_PD1. A delay circuit generates ZCLK_PDD0, ZCLK_PDD1 obtained by delaying ZCLK_PD0, ZCLK_PD1 respectively by Tc (=a backward amount of CLK_P with respect to an external clock+a delay amount of an internal clock with respect to the external clock). A frequency division select instruction circuit generates ZSEL0, ZSEL1 based on an internal clock CLK, and ZCLK_PDD0, PDD1. A ZSEL0 shifter circuit generates ZSEL1_D2 including a clock pulse of ZSEL1. A ZCLK_P #2 select circuit selects a clock pulse of ZCLK_PD0 using ZSEL1_D2.

7 Claims, 19 Drawing Sheets

SEMICONDUCTOR MEMORY DEVICE HAVING CONFIGURATION FOR SELECTING DESIRED DELAY LOCKED LOOP CLOCK

BACKGROUND OF THE INVENTION

1. Field of the Invention

The present invention relates to a semiconductor memory device, and more particularly to a DDR SDRAM (Double Data Rate Synchronous Dynamic Random Access Memory).

2. Description of the Background Art

Among synchronous dynamic random access memories (SDRAM) operating in synchronization with an externally provided clock signal, the one in which data is input/output in synchronization with a rising edge and a falling edge of an external clock signal is called a double data rate synchronous dynamic random access memory (Double Data Rate SDRAM, hereinafter, referred to as a "DDR SDRAM").

In the DDR SDRAM, data read from a memory cell array performed in an external clock cycle is based on a prefetch operation in which $2^N$ bit data is read to each data output circuit in one read operation.

A DDR SDRAM having N set to 1 is referred to as a DDR-I, while a DDR having N set to 2 is referred to as a DDR-II. The specifications for the DDR-I and the DDR-II are defined by JEDEC (Joint Electron Device Engineering Council).

A clock used in the DDR SDRAM will now be described. The DDR SDRAM has external clocks EXTCLK and EXTZCLK input. Triggered by these external clocks EXTCLK and EXTZCLK, an internal clock CLK as well as delay locked loop (DLL) clocks CLK_P and CLK_N are generated. In reading, in each circuit in the DDR, a clock at an appropriate timing among these clocks is selected, and data in a memory cell is successively pipelined and output to the outside.

The Japanese Patent Laying-Open No. 11-353878 discloses a semiconductor integrated circuit, which, in selecting a clock having a leading phase out of a DLL clock and EXTCLK, selects a DLL clock without comparing phases when a frequency is high. Though the disclosure of the reference is similar to the present invention in selecting the DLL clock, there is a difference in a problem to be solved, a configuration, and an effect thereof.

On the other hand, in order to select DLL clock CLK_P required in a processing at a specific stage in the aforementioned pipeline, a following problem exists.

When it is assumed that a backward amount of DLL clock CLK_P with respect to external clock EXTCLK is represented as Ta, a delay amount of internal clock CLK with respect to EXTCLK is represented as Tb, and a cycle time is represented as Tck, a condition of Ta+Tb<Tck should be satisfied. Therefore, if cycle time Tck is shortened, values for Ta and Tb should also be made smaller.

For example, in the DDR-II, Tck is set to 3 ns (Tck=3 ns). In such an example, a condition of Ta+Tb<3 ns should be satisfied. Under this condition, it is difficult to secure and assure a margin considering process fluctuation, in a variety of operational environments where an operation temperature, an operation voltage, or the like is different.

SUMMARY OF THE INVENTION

An object of the present invention is to provide a semiconductor memory device accurately selecting a DLL clock corresponding to a desired external clock, even if a cycle time is short.

A semiconductor memory device according to one aspect of the present invention inputs/outputs data in synchronization with a rise and fall of an external clock. The semiconductor memory device includes a first internal clock generation circuit generating a first internal clock having a constant delay amount with respect to the external clock having a cycle T; a second internal clock generation circuit generating a second internal clock having a constant backward amount with respect to the external clock, in order to synchronize a timing for outputting the data to the outside with the external clock; a frequency divider dividing a frequency of the second internal clock into N ($\geq 2$) to output cyclically sequenced N frequency division clocks; a first circuit specifying a frequency division clock including a second internal clock pulse having a constant phase difference from a first internal clock pulse corresponding to an external clock pulse indicating a timing for input of a read command, among the N frequency division clocks; and a second circuit selecting the second internal clock pulse corresponding to each external clock pulse after the input of the read command, when the specified frequency division clock is regarded as a starting point.

According to the semiconductor memory device of the present invention, even if cycle T is short, the second internal clock (DLL clock) corresponding to the desired external clock can accurately be selected.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described with reference to the figures.

(First Embodiment)

Figure 1:
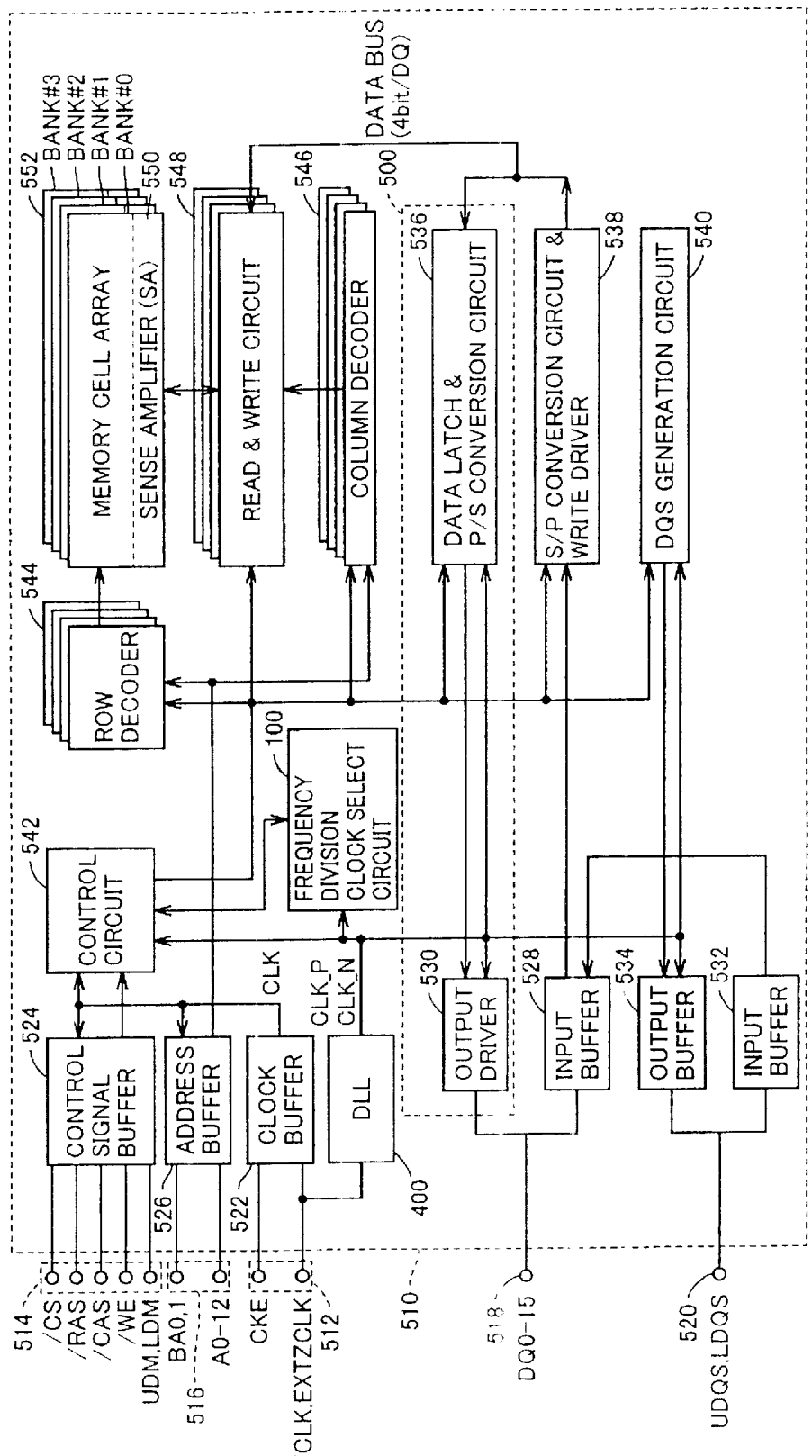
FIG. 1 is a schematic block diagram showing an overall configuration of a semiconductor memory device 510 according to an embodiment of the present invention.

FIG. 1 is a schematic block diagram showing an overall configuration of a semiconductor memory device 510 according to the present embodiment. The figure shows only a main portion involved in data input/output in semiconductor memory device 510 as a representative.

Referring to FIG. 1, semiconductor memory device 510 includes: a clock terminal 512; a control signal terminal 514; an address terminal 516; a data input/output terminal 518; a data strobe signal input/output terminal 520; a clock buffer 522; a control signal buffer 524; an address buffer 526; an input buffer 528 associated with data DQ0 to DQ15; an input buffer 532 and an output buffer 534 associated with data strobe signals UDQS, LDQS; an output circuit 500; an S/P (serial/parallel) conversion circuit & write driver 538; a DQS generation circuit 540; a DLL circuit 400; a frequency division clock select circuit 100; a control circuit 542; a row decoder 544; a column decoder 546; a read & write circuit 548; a sense amplifier 550; and a memory cell array 552.

In the present embodiment, semiconductor memory device 510 is assumed as the DDR-II. In other words, semiconductor memory device 510 has a 4-bit prefetch configuration, in which 4×n bit (n represents a bit width in a semiconductor memory device, that is, the number of DQ terminals; in semiconductor memory device 510, it is assumed that n=16) data is read at one time, in data read from memory cell array 552 performed in an external clock cycle. That is, each 4-bit data is read from memory cell array 552 every one cycle of the external clock with respect to n output circuits 100, and in each output circuit 100, the 4-bit data is sequenced, transferred every half cycle, and output to the outside.

In addition, in data write, semiconductor memory device 510 takes in n-bit (n=16) data every half cycle of the external clock, in synchronization with the rise and fall of the external clock, and writes into memory cell array 552, 4×n bit data at one time in one cycle of the external clock.

Memory cell array 552 consists of a plurality of memory cells, each storing data. Memory cell array 552 consists of four banks, each capable of independent operation.

Clock terminal 512 receives external clock signals EXTCLK, EXTZCLK which are complementary to each other, as well as a clock enable signal CKE. Control signal terminal 514 receives command control signals such as a chip select signal /CS, a row address strobe signal /RAS, a column address strobe signal /CAS, a write enable signal /WE, and input data mask signals UDM, LDM.

Address terminal 516 receives address signals A0–A12 and bank address signals BA0, BA1.

Data input/output terminal 518 communicates data read and written in semiconductor memory device 510 with the outside. Data input/output terminal 518 receives externally input data DQ0–DQ15 in data write, while it outputs data DQ0–DQ15 to the outside in data read.

Data strobe signal input/output terminal 520 receives from the outside data strobe signals UDQS, LDQS for reading data DQ0–DQ15 from the outside in data write, while it outputs to the outside data strobe signals UDQS, LDQS in order for an external controller to read data DQ0–DQ15 in data read.

Clock buffer 522, upon receiving external clock signals EXTCLK, EXTZCLK and clock enable signal CKE, generates internal clock signals CLK, ZCLK, and outputs the signals to control signal buffer 524, address buffer 526 and DLL circuit 400.

Control signal buffer 524 takes in and latches chip select signal /CS, row address strobe signal /RAS, column address strobe signal /CAS, write enable signal /WE, and input data mask signals UDM, LDM in synchronization with the internal clock received from clock buffer 522, and outputs the command control signal to control circuit 542.

Address buffer 526 takes in and latches address signals A0–A12 and bank address signals BA0, BA1 in synchronization with the internal clock signal received from clock buffer 522, and generates an internal address (a row address XA and a column address CA), which is output to row decoder 544 and column decoder 546.

Row decoder 544 carries out row select in memory cell array 510 in accordance with row address XA. Specifically, row decoder 544 controls selective activation of word lines (not shown) arranged for each memory cell row in memory cell array 510.

Column decoder 546 carries out column select in memory cell array 510 in accordance with column address CA. Specifically, column decoder 546 selectively connects a plurality of sense amplifiers to read & write circuit 548 via an I/O line (not shown) within the array in memory cell array 510. In 4-bit prefetch scheme, column decoder 546 selects specific, multiple columns using a higher-order address obtained by excluding the least significant 2 bits among column addresses CA generated in address buffer 526.

Sense amplifier 550 amplifies a slight potential difference read on a bit line by activation of the word line.

Read & write circuit 548 includes a read circuit 600 (not shown) amplifying the data in the memory cell for output to a data bus pair, and a write circuit 610 (not shown) amplifying the data on the data bus pair for output to the memory cell.

Output circuit 500 consists of a data latch & P/S conversion circuit 536 and an output driver 530.

Data latch & P/S conversion circuit 536 amplifies read data provided from read & write circuit 548 in accordance with control signals EZORG0, EZORG1, ZRDAI provided from control circuit 542 in data read. Data latch & P/S conversion circuit 536 performs P/S conversion (parallel/serial conversion) on the amplified read data. In other words, in the 4-bit prefetch scheme, data latch & P/S conversion circuit 536 sequences 4 data (parallel data) read at one time with respect to each data DQi (i: 0 to 15), that is, converts to the serial data, for output to output driver 530.

Output driver 530 outputs to data input/output terminal 518, data DQ0–DQ15 converted to serial data.

In the 4-bit prefetch scheme, in data write, S/P conversion circuit & write driver 538 outputs to read & write circuit 548 in 4-bit parallel every one cycle of the external clock, each data DQi received by one bit from input buffer 528 every half cycle of the external clock.

Input buffer 532 receives from the outside data strobe signals UDQS, LDQS.

Input buffer 528 receives data DQ0–DQ15 in synchronization with data strobe signals UDQS, LDQS received from the outside by input buffer 532.

Output buffer 534 takes in data strobe signals UDQS, LDQS generated by DQS generation circuit 540 operating in synchronization with an output of DLL circuit 511. Output buffer 534 operates in synchronization with the output of DLL circuit 400 along with output driver 530 outputting data DQ0–DQ15, and outputs data strobe signals UDQS, LDQS to data strobe signal input/output terminal 520.

Control circuit 542, in synchronization with the output of clock buffer 522, takes in the command control signal from control signal buffer 524, and controls row decoder 544, column decoder 546 and read & write circuit 548, based on the taken-in command control signal. Read and write of data DQ0–DQ15 with respect to memory cell array 552 is thus carried out. In addition, control circuit 542 also controls generation of the data strobe signal in DQS generation circuit 540 based on the taken-in command control signal.

Further, control circuit 542 sets a level of control signals RDT, EN, COL, WZR and CP00.

In other words, control circuit 542 uses CLK_P#2 as a trigger to set control signal RDT to "H". Control circuit 542 sets control signal EN to "H" after receiving an ACT command, and sets control signal EN to "L" after receiving a precharge command. Control command 542 sets COL to "H" during one cycle following the rise of internal clock CLK in a cycle in which a READ command has been input. Control circuit 542 sets WZR to "L" during a READ period from when the READ command is input until when last data D4 is output. Control circuit 542 sets CP00 to "H" during a burst period following the rise of internal clock CLK in a cycle in which the READ command has been input, that is, during 2 cycles in the case of the DDR-II.

(Timing)

Next, referring to FIG. 2, a timing for data output in reading data from the DDR-II will be described.

With regard to this DRAM, the number of data to be prefetched is set to 4 bits, a CAS latency CL is set to 4, a burst length BL is set to 4, and addressing is set to interleave Int. CAS latency represents the number of cycles from when the DDR-II receives the READ command (a command for reading data) from the outside until when it starts to output the read data to data input/output terminal 518.

Here, one cycle is assumed as a period from the rise of external clock EXTCLK to a next rise. The burst length represents the number of bits that are successively read in response to the READ command.

Figure 2:
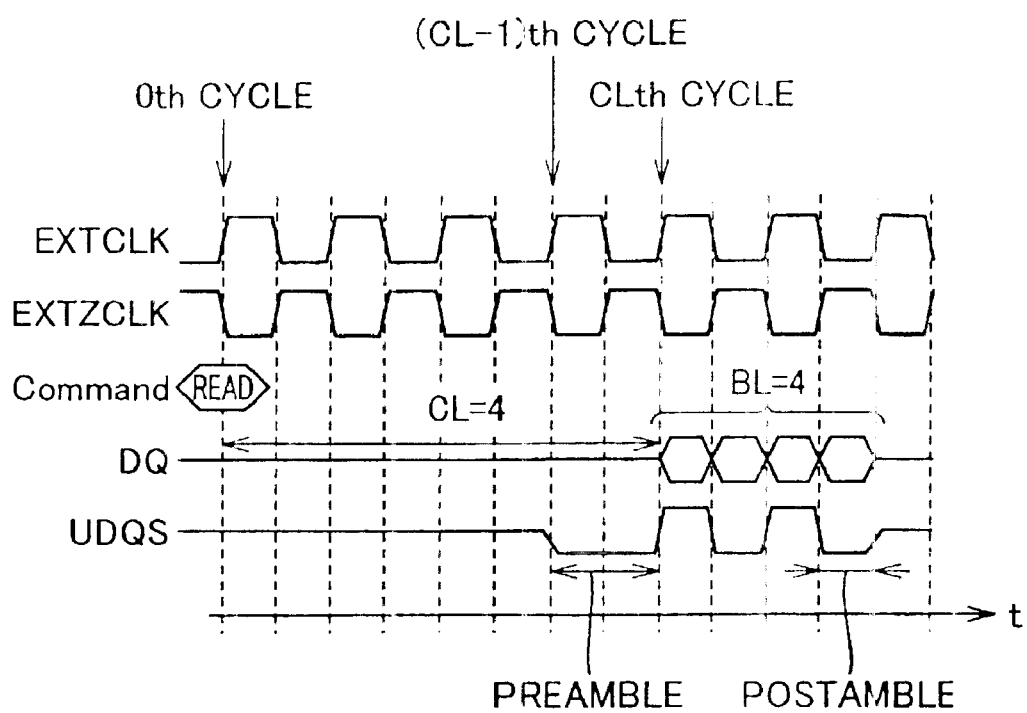
FIG. 2 shows a timing for data output in reading data from a DDR-II.

Referring to FIG. 2, external clocks EXTCLK and EXTZCLK repeat a high level (hereinafter, also referred to as "H level") and a low level (hereinafter, also referred to as "L level") in a constant cycle.

In the DDR-II, 4-bit prefetched data is subjected to P/S conversion. Each data is synchronized with the external clock, and output as read data DQ. In addition, data strobe signal DQS is output in synchronization with the external clock. Data strobe signal DQS is used as a timing signal for taking in data DQ in the external controller which receives data DQ.

As shown in FIG. 2, data strobe signal DQS attains "L" during one cycle starting from (CL−1)th cycle to (CL)th cycle, when the input of the READ command is regarded as a starting point. This period is referred to as "Preamble".

Further, data strobe signal DQS attains "L" for a half cycle after the last data D4 is output. This period is referred to as "Postamble".

Here, a time difference tAC between edges of external clocks EXTCLK and EXTZCLK and a timing for the output of data DQ is defined so as to fall within a prescribed range. In addition, a time difference tDQSQ between the edge of data strobe signal DQS and the timing of the output of data DQ is also defined so as to fall within a prescribed range. FIG. 2 shows an example in which relations of tAC=0 and tDQSQ=0 are attained.

In order to achieve data output shown in FIG. 2, in output circuit 500, an operation clock with a timing slightly earlier than a timing of the edge of external clock EXTCLK is required. This is because a delay will be caused from when the external clock is input to the semiconductor memory device until when the data is actually output, depending on a capacity each internal circuit has.

External clock EXTCLK is a signal of a fixed cycle. Therefore, a clock generation circuit should be provided, which can generate clocks CLK_P, CLK_N moved backward behind the edge of external clock EXTCLK by an appropriate time Ta by delaying external clock EXTCLK by an appropriate delay amount Td, and which can also control delay amount Td so that data DQ output from the data output circuit that operates triggered by clocks CLK_P, CLK_N, and data strobe signal DQS output from the data strobe signal output circuit satisfy the aforementioned timing differences tAC, tDQSQ. A circuit generating such a clock is referred to as a DLL (Delay Locked Loop) circuit.

A backward amount Ta is determined by a propagation time until the read data is taken in, being triggered by clocks CLK_P, CLK_N, and until the read data is finally read to the data output terminal.

Figure 3:
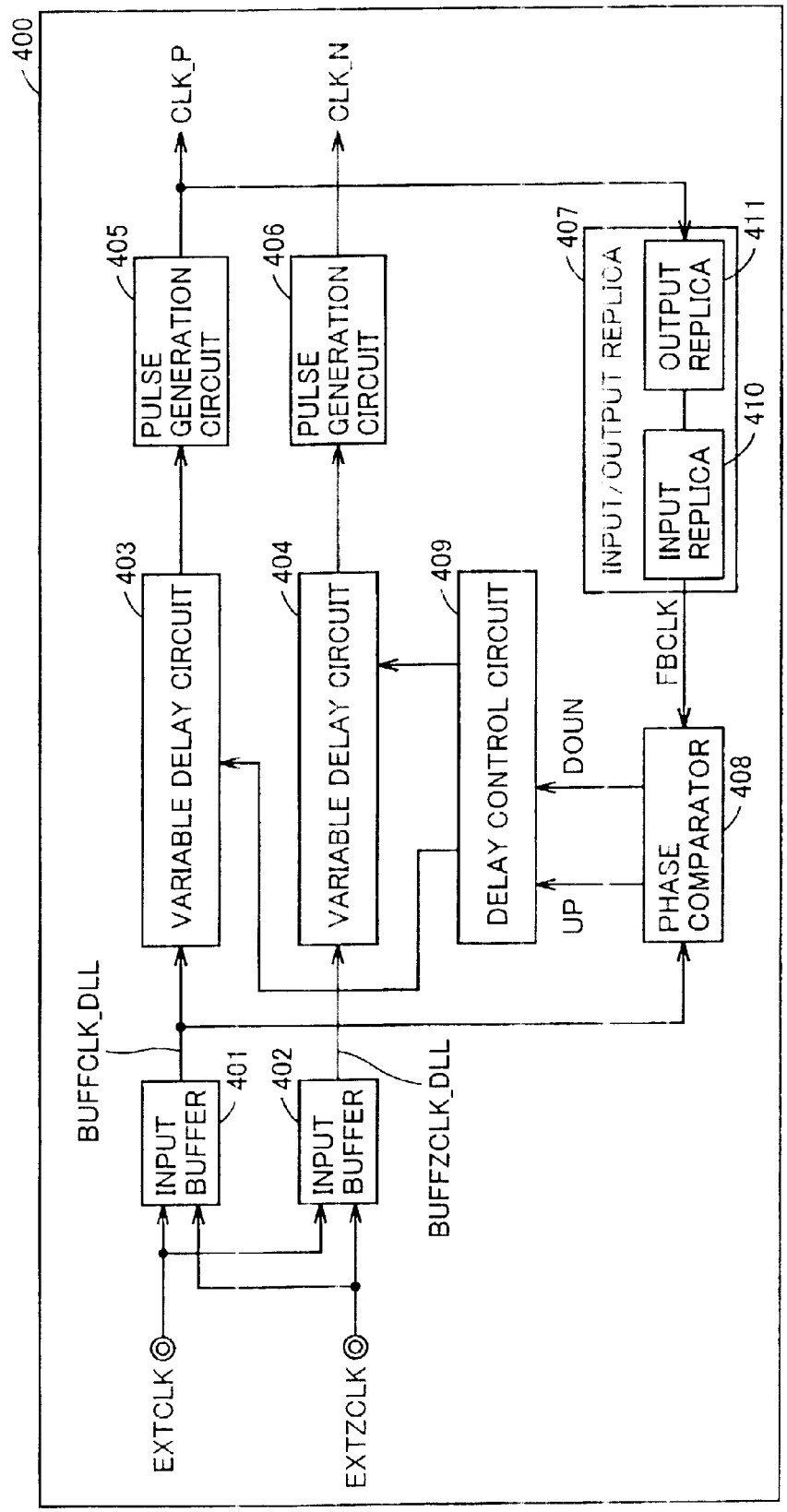
FIG. 3 shows a configuration of a DLL circuit 400.

DLL circuit 400 shown in FIG. 3 includes input buffers 401, 402, variable delay circuits 403, 404, pulse generation circuits 405, 406, an input/output replica circuit 407, a phase comparator 408, and a delay control circuit 409.

Input buffer 401, upon receiving external clocks EXTCLK, EXTZCLK input from the outside, detects an intersection of a potential level at the rise of external clock EXTCLK and a potential level at the fall of external clock EXTZCLK, which is a complementary signal of the former, to generate an internal clock BUFFCLK_DLL.

Input buffer 402, upon receiving external clocks EXTCLK, EXTZCLK input from the outside, detects an intersection of a potential level at the fall of external clock EXTCLK and a potential level at the rise of external clock EXT/CLK, to generate an internal clock BUFFZCLK_DLL.

Variable delay circuit 403 delays internal clock BUFFCLK_DLL received from input buffer 401, which is output to pulse generation circuit 405. Variable delay circuit 404 includes a plurality of delay units generating delay, and adjusts a delay amount of internal clock BUFFCLK_DLL by connecting/disconnecting the delay unit based on an instruction from delay control circuit 409.

Pulse generation circuit 405 generates internal clock CLK_P as a pulse signal in synchronization with the rising edge of a signal output from variable delay circuit 403.

Variable delay circuit 404 delays internal clock BUFF/CLK_DLL received from input buffer 402, which is output to pulse generation circuit 406. Variable delay circuit 404 has a configuration similar to variable delay circuit 403, and description therefor will not be repeated.

Pulse generation circuit 406 generates internal clock CLK_N as a pulse signal in synchronization with the rising edge of a signal output from variable delay circuit 404.

Input/output replica circuit 407 consists of an output replica 411 reproducing, in a simulated manner, a circuit characteristic from when internal clocks CLK_P, CLK_N are output from DLL circuit 100 until when data DQ is output to the data input/output terminal, and an input replica 410 reproducing, in a simulated manner, a circuit characteristic of input buffer 401.

Output replica 411 has internal clock CLK_P input, and delays CLK_P by backward amount Ta for output.

Phase comparator 408 compares a phase of an internal clock FBCLK output from input/output replica circuit 407 with that of internal clock BUFFCLK_DLL one cycle or several cycles later. Based on that phase difference, phase comparator 408 generates control signals UP and DOWN for increasing/decreasing the delay amount of variable delay circuits 403, 404.

Delay control circuit 409 generates a delay control signal based on control signals UP and DOWN, which is output to variable delay circuits 403, 404, and adjusts the delay amount in variable delay circuits 403, 404.

When the phases of internal clock BUFFCLK_DLL and internal clock FBCLK match, control signals UP and DOWN are not output from phase comparator 408, but the delay control signal attains a certain fixed value, and the delay amount in variable delay circuits 403, 404 is fixed. Thus, internal clocks CLK_P, CLK_N will be a signal having a phase ahead of external clocks EXTCLK, EXTZCLK, by the sum of the delay amount from DLL circuit 400 to the output circuit and the delay amount of the data output in the output circuit.

On the other hand, when the phases of internal clock BUFFCLK_DLL and internal clock FBCLK do not match, control signals UP and DOWN are output from phase comparator 408 in accordance with the phase difference. The delay amount is adjusted by connecting/disconnecting the delay unit in variable delay circuits 403, 404.

Figure 4:
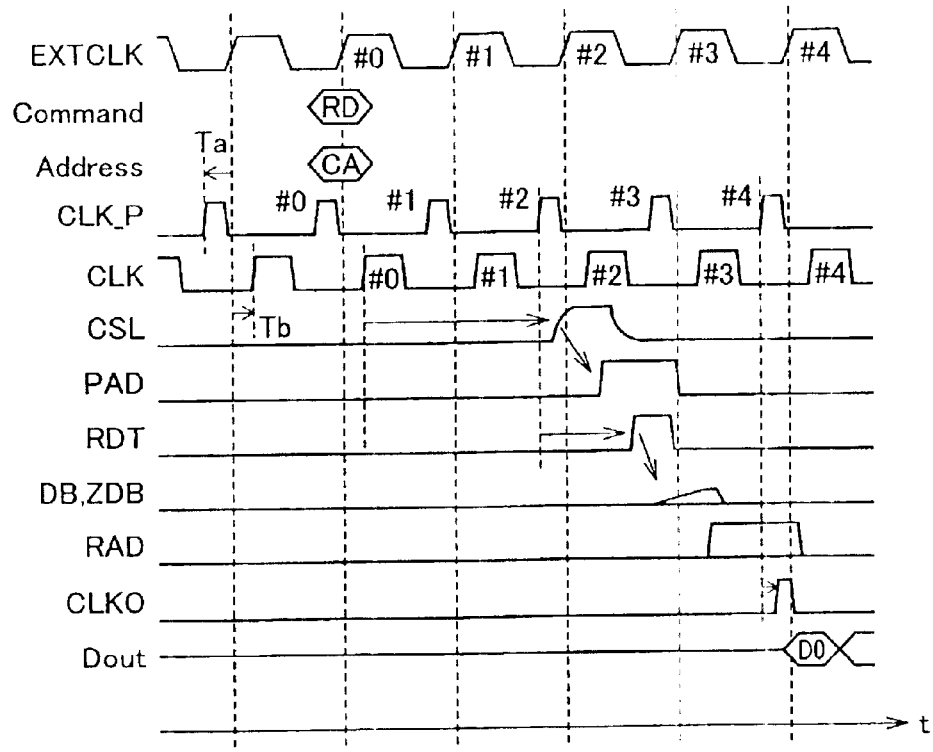
FIG. 4 shows a timing of level change of a signal associated with data read of the DDR-II.

Next, referring to FIG. 4, a timing of level change of a signal associated with data read in the DDR-II will be described.

External clocks EXTCLK, EXTZCLK repeat the high level (hereinafter, also referred to as "H level") and the low level (hereinafter, also referred to as "L level") in a constant cycle.

Clock buffer 522 generates internal clock CLK with external clocks EXTCLK and EXTZCLK. Internal clock CLK is delayed by Tb with respect to external clock EXTCLK.

First, a word line WL corresponding to a row address is raised to "H" level of a select level by row decoder 544, and data in accordance with the data in the memory cell is output to a bit line pair BL, /BL. Then, a sense amplifier 505 is activated, and the data on the bit line pair BL, /BL is amplified.

At the rising edge of an external clock signal EXTCLK#0, the Read command (/RAS=H, /CAS=L, /WE=H) and column address CA are received.

Next, triggered by internal clock CLK#0, column decoder 546 selects a column select line CSL associated with column address CA. The data on bit line pair BL, /BL corresponding to column select line CSL is output to read circuit 600 via an I/O line pair.

Read circuit 600 amplifies the input data, and holds the amplified data PADn (n=0 to 3).

Next, triggered by CLK_P#2, a control signal RDT is activated in control circuit 542. Then, triggered by that activation, data PADn (n=0 to 3) held in read circuit 600 is output to a data bus pair DBn, ZDBn (n=0 to 3).

Output circuit 500 takes in and amplifies the data on data bus pair DBn, ZDBn (n=0 to 3) for P/S (parallel/serial conversion), and holds the data RADn (n=0 to 3) that has been subjected to P/S conversion.

Triggered by a clock signal CLKO consisting of a logical sum of DLL clocks CLK_P and CLK_N, output circuit 500 reads data RADn (n=0 to 3) to provide data D0 to D3, and outputs the data to the outside from data input/output terminal 518 successively.

In the above-described operation, control signal RDT should be activated at an appropriate timing. Here, control signal RDT is activated triggered by CLK_P#2. Therefore, in order to activate control signal RDT at an appropriate timing, it is important to ensure that CLK_P#2 is selected, not CLK_P#3 and CLK_P#4.

(Conventional Method of Selecting CLK_P)

First, a conventional method of selecting CLK_P will be described.

Figure 5:
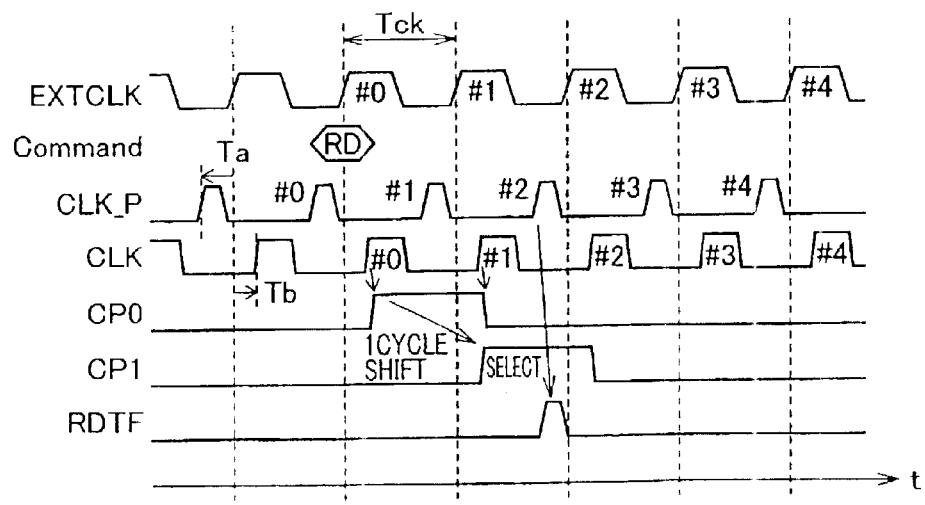
FIG. 5 shows a timing of level change of a signal involved in selecting CLK_P in a conventional method of selecting CLK_P.

FIG. 5 shows a timing of level change of a signal involved in selecting CLK_P in the conventional method of selecting CLK_P.

Referring to FIG. 5, a control signal CP0 is set to "H" during one cycle after the rise of CLK#0. Next, a control signal CP1 obtained by shifting CP0 by one cycle is generated. Control signal CP1 starts from the rise of CLK#1. Therefore, if one cycle time Tck is sufficiently long, CLK_P#2 will be included in a period during which CP1 attains "H". Therefore, if CLK_P within a period in which CP1 attains "H" is selected, CLK_P#2 can be obtained. With CLK_P#2 thus obtained, an RDTF which serves as an original signal of control signal RDT is generated.

The method of selecting CLK_P#2 as described above depends on one cycle time Tck as described below.

CP1 starts from CLK#1, and based on this, CLK_P#2 for the next cycle is selected. A time difference $\Delta T$ between a timing of the rising edge of CLK#1 and a timing of the rising edge of CLK_P#2 is expressed as $\Delta T=(Tck-Ta-Tb)$. In order to capture CLK_P#2 with CP1, $\Delta T$ should be larger than 0 ($\Delta T>0$). That is, (Ta+Tb) should be smaller than Tck ((Ta+Tb)<Tck).

When one cycle time Tck is shortened, it will be difficult to satisfy this condition. For example, in the DDR-II, a maximum operation frequency is set to 333 MHz, and one cycle time Tck is set to 3 ns. Therefore, (Ta+Tb) should be smaller than 3 ns ((Ta+Tb)<3 ns).

(Frequency Division Clock Select Circuit According to the Present Embodiment)

Next, a frequency division clock select circuit selecting CLK_P according to the present embodiment will be described.

Figure 6:
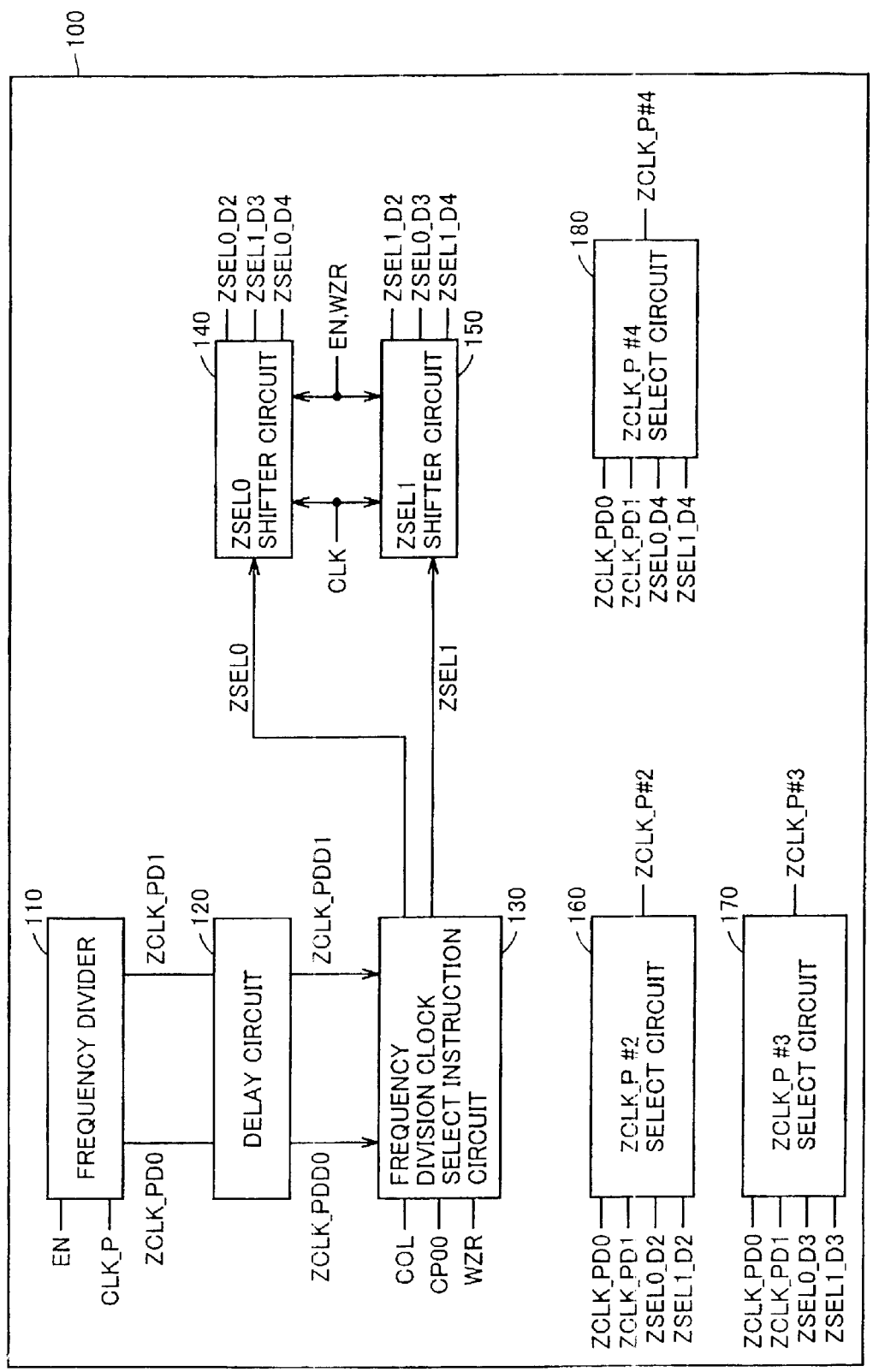
FIG. 6 shows a configuration of a frequency division clock select circuit 100 according to the embodiment of the present invention.

A frequency division clock select circuit 100 shown in FIG. 6 is constituted with a frequency divider 110, a delay circuit 120, a frequency division clock select instruction circuit 130, a shifter circuit 140, a shifter circuit 150, a ZCLK_P#2 select circuit 160, a ZCLK_P#3 select circuit 170, and a ZCLK_P#4 select circuit 180. These circuits will now be described.

(Frequency Divider)

Frequency divider 110 divides the frequency of CLK_P into two, and outputs two frequency division clocks ZCLK_PD0 and ZCLK_PD1. These frequency division clocks are cyclically sequenced. In other words, the frequency division clocks are sequenced in the order of ZCLK_PD0→ZCLK_PD1→ZCLK_PD0→ZCLK_PD1 . . .

Figure 7:
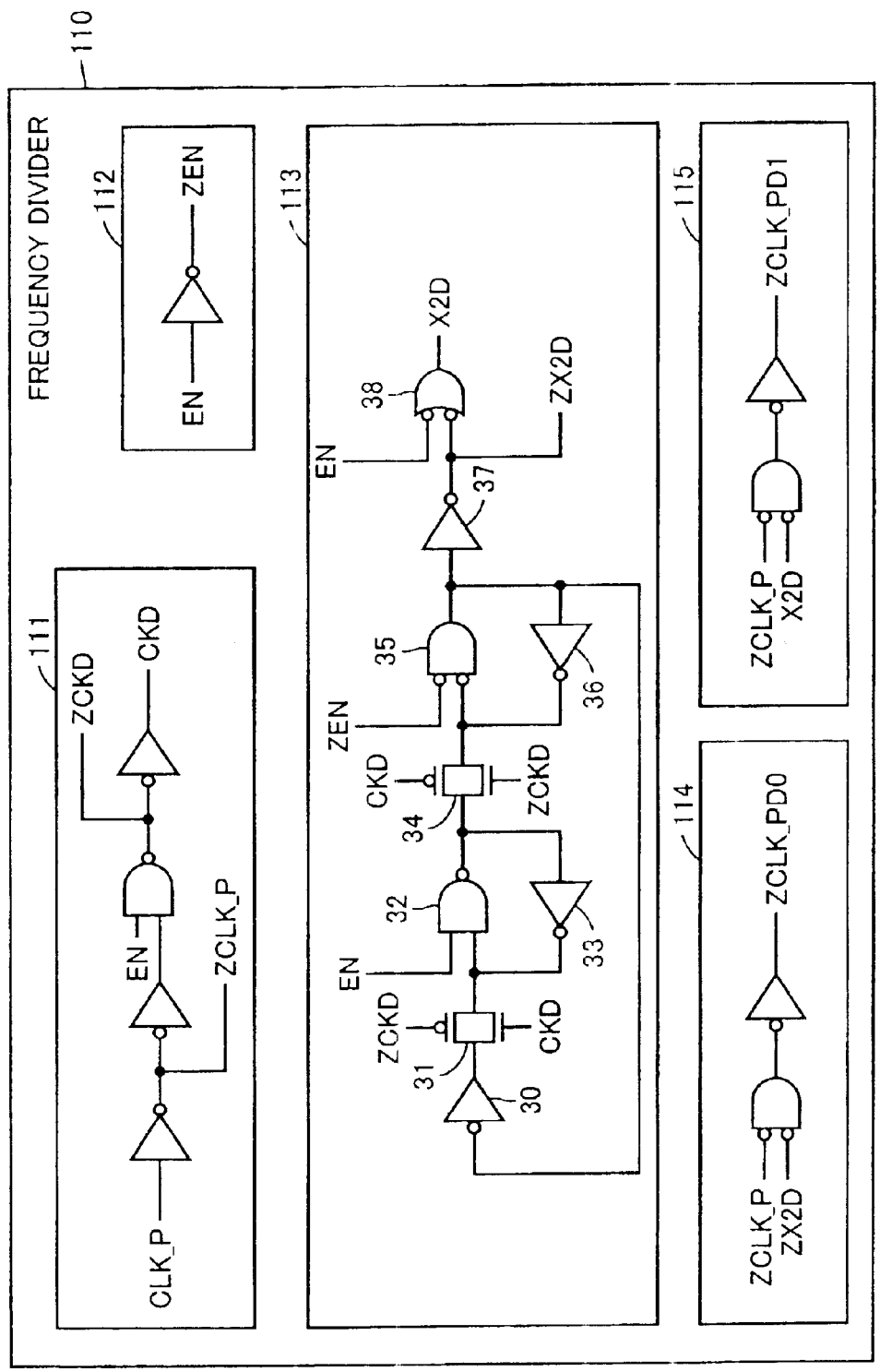
FIG. 7 shows a configuration of a frequency divider 110.
Figure 8:
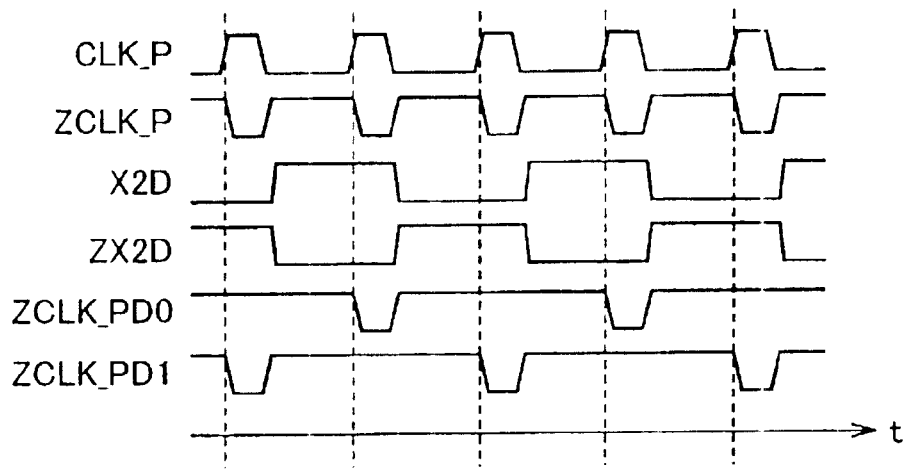
FIG. 8 shows a timing of level change of a signal associated with frequency divider 110.

FIG. 7 shows a configuration of frequency divider 110. FIG. 8 shows a timing of level change of a signal associated with frequency divider 110. Frequency divider 110 includes a CKD & ZCKD generation circuit 111, a ZEN generation circuit 112, an X2D & ZX2D generation circuit 113, a ZCLK_PD0 generation circuit 114, and a ZCLK_PD1 generation circuit 115.

Control signal EN in FIG. 7 is generated in control circuit 542. Control circuit 542 sets control signal EN to "H" after receiving the ACT command, and sets control signal EN to "L" after receiving the precharge command.

CKD & ZCKD generation circuit 111 sets ZCLK_P to "L", CKD to "H", and ZCKD to "L" during CLK_P="H".

ZEN generation circuit 112 sets ZEN to "L" during EN="H".

X2D & ZX2D generation circuit 113 generates X2D and ZX2D as shown in FIG. 8. X2D and ZX2D are clock signals of a frequency half the CLK_P, and levels thereof vary in a following manner.

When ZCKD attains "L" (that is, ZCLK_P="L"), a transmission gate 31 is electrically connected, and output data of an inverter 30 is latched in a latch unit consisting of an NAND circuit 32 and an inverter 33. Thereafter, when CKD attains "L" (that is, CLK_P="H"), a transmission gate 34 is electrically connected, and the data latched in the latch unit is output. Consequently, the levels of X2D and ZX2D vary. Thus, X2D and ZX2D vary to ZCLK_P="L", and in addition, when CLK_P attains "L", the level thereof will vary.

ZCLK_PD0 generation circuit 114 and ZCLK_PD1 generation circuit 115 use X2D and ZX2D as mask signals, and generates two clocks ZCLK_PD0 and ZCLK_PD1 of a frequency half the CLK_P from CLK_P.

In other words, ZCLK_PD0 generation circuit 114 sets ZCLK_PD0 to "L" during ZCLK_P="L" and ZX2D="L". ZCLK_PD1 generation circuit 115 sets ZCLK_PD1 to "L" during ZCLK_P="L" and X2D="L".

As described above, frequency divider 110 generates a clock obtained by dividing the frequency of CLK_P into two. That is, CLK_P is divided into two frequency division clocks ZCLK_PD0 and ZCLK_PD1 by frequency divider 110.

(Delay Circuit)

Delay circuit 120 delays frequency division clocks ZCLK_PD0 and ZCLK_PD1 by Tc (=Ta+Tb), and outputs two delay frequency division clocks ZCLK_PDD0 and ZCLK_PDD1.

Figure 9:
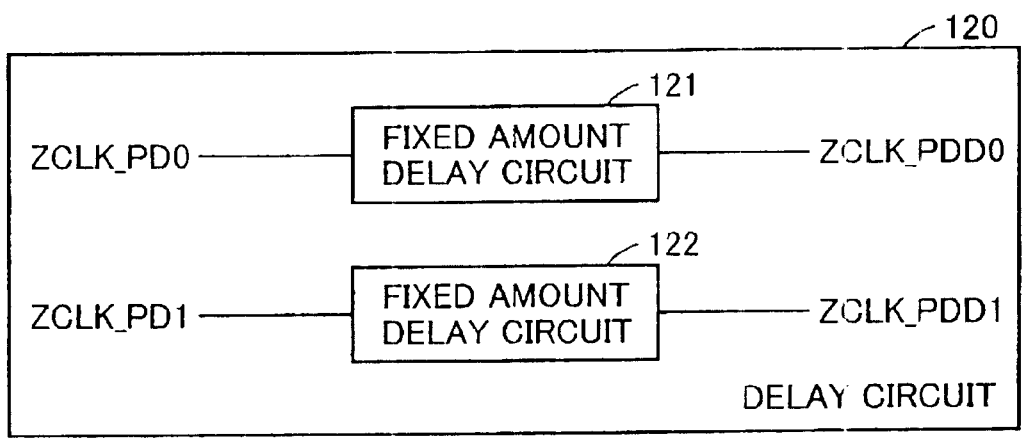
FIG. 9 shows a configuration of a delay circuit 120.

FIG. 9 shows a configuration of delay circuit 120. In the present embodiment, it is assumed that a value for Tc (=Ta+Tb) is constant, and does not vary in accordance with a value of a temperature or a voltage. Delay circuit 120 consists of a fixed amount delay circuit 121 outputting ZCLK_PDD0 obtained by delaying ZCLK_PD0 by Tc (=Ta+Tb), and a fixed amount delay circuit 122 outputting ZCLK_PDD1 obtained by delaying ZCLK_PD1 by Tc (=Ta+Tb).

(Frequency Division Clock Select Instruction Circuit)

Frequency division clock select instruction circuit 130 specifies out of two frequency division clocks ZCLK_PD0 and ZCLK_PD1, a frequency division clock to which a clock pulse having a phase difference of Tc from CLK#0 belongs.

More specifically, frequency division clock select instruction circuit 130 specifies out of two delay frequency division clocks ZCLK_PDD0 and ZCLK_PDD1, a delay frequency division clock including a clock pulse in a period in which CLK#0 is generated, and specifies a frequency division clock corresponding to that delay frequency division clock.

Frequency division clock select instruction circuit 130 generates a pulse of ZSEL0="L" when frequency division clock ZCLK_PD0 is specified as a frequency division clock, while it generates a pulse of ZSEL1="L" when frequency division clock ZCLK_PD1 is specified.

Figure 10:
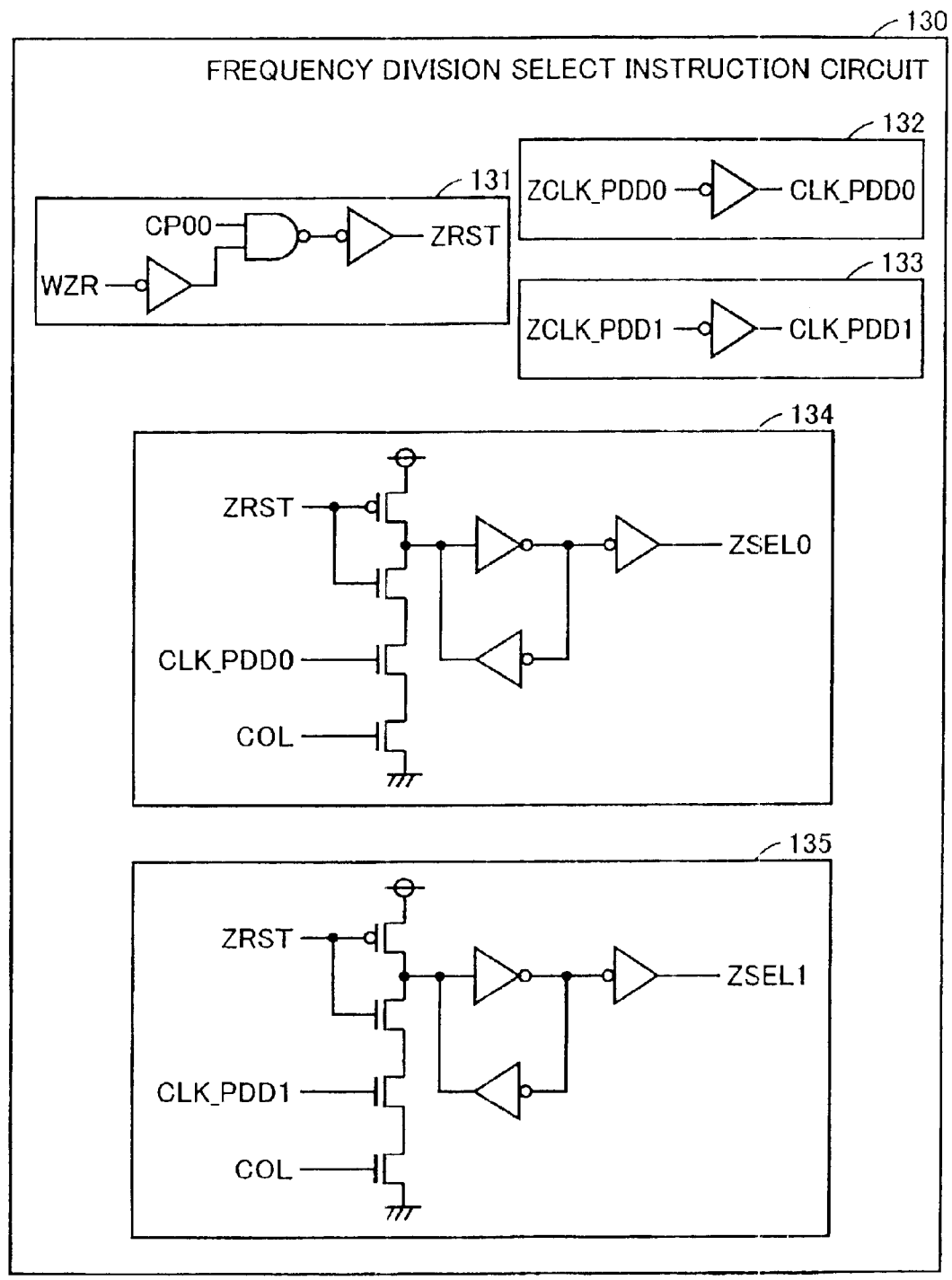
FIG. 10 shows a configuration of a frequency division clock select instruction circuit 130.

Frequency division clock select instruction circuit 130 shown in FIG. 10 outputs select instruction signals ZSEL0 and ZSEL1 instructing which of two frequency division clocks ZCLK_PDD0 and ZCLK_PDD1 is to be selected. Referring to FIG. 10, frequency division clock select instruction circuit 130 includes a ZRST generation circuit 131, a CLK_PDD0 generation circuit 132, a CLK_PDD1 generation circuit 133, a ZSEL0 generation circuit 134, and a ZSEL1 generation circuit 135.

Control signals COL, WZR and CP00 in FIG. 10 are generated in control circuit 542. Control circuit 542 sets COL to "H" for a certain period (for example, a width approximately similar to CLK) from the rise of internal clock CLK in a cycle in which the READ command has been input.

Control circuit sets WZR to "L" for a READ period from when the READ command is input until when the last data D4 is output.

Control circuit 542 sets CP00 to "H" for a burst period from the rise of internal clock CLK in a cycle in which the READ command is input, that is, during two cycles in the DDR-II.

ZRST generation circuit 131 sets ZRST to "H" during CP00="H", while it sets ZRST to "L" during CP00="L".

CLK_PDD0 generation circuit 132 generates CLK_PDD0 obtained by inverting a level of ZCLK_PDD0.

CLK_PDD1 generation circuit 133 generates CLK_PDD1 obtained by inverting a level of ZCLK_PDD1.

ZSEL0 generation circuit 134 sets ZSEL0 to "L" until ZRST attains "L" (that is, CP00="L"), when CLK_PDD0 attains "H" (that is, ZCLK_PDD0="L"), COL attains "H", and ZRST attains "H".

ZSEL1 generation circuit 135 sets ZSEL1 to "L" until ZRST attains "L" (that is, CP00="L"), when CLK_PDDL attains "H" (that is, ZCLK_PDD1="L"), COL attains "H", and ZRST attains "H".

(ZSELn Shifter Circuit)

A ZSELn shifter circuit generates ZSEL0_D2 or ZSEL1_D2 serving as a pulse for a period of 2×Tck from the rising edge of CLK#0; generates ZSEL0_D3 or ZSEL1_D3 serving as a pulse for a period of 2×Tck from the rising edge of CLK#1; and generates ZSEL0_D4 or ZSEL1_D4 serving as a pulse for a period of 2×Tck from the rising edge of CLK#2.

Figure 11:
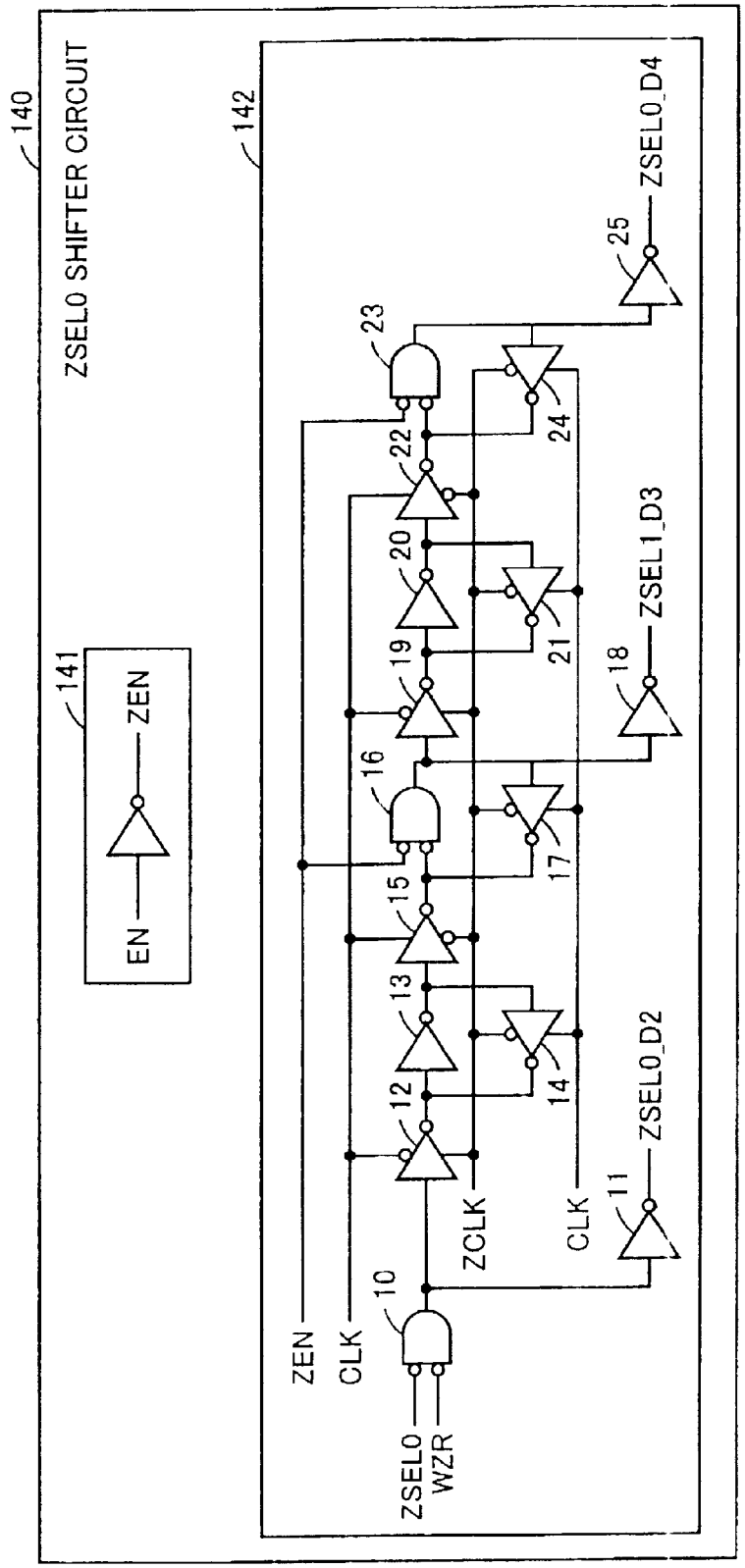
FIG. 11 shows a configuration of a ZSEL0 shifter circuit 140.

A ZSEL0 shifter circuit 140 shown in FIG. 11 is constituted with a ZEN generation circuit 141 and a shift signal generation circuit 142.

ZEN generation circuit 141 generates a ZEN obtained by inverting the level of control signal EN.

Shift signal generation circuit 142 generates ZSEL0_D2, ZSEL0_D3 and ZSEL0_D4, as shown below.

An NAND circuit 10 and an inverter 11 output ZSEL0_D2 from ZSEL0. During ZSEL0="L" and ZSEL0_D2="L", almost no shift occurs.

When a clocked inverter 12 is electrically connected while CLK="L", ZSEL is latched in the latch unit consisting of an inverter 13 and an inverter 14. Thereafter, when a clocked inverter 15 is electrically connected while ZCLK="L", the latched data is output, and ZSEL1_D3 is output from an inverter 18.

As described above, a period in which ZSEL1_D3 attains "L" is shifted by one cycle from a period in which ZSEL0 attains "L".

Similarly, when a clocked inverter 19 is electrically connected while CLK="L", ZSEL1_D3 is latched in the latch unit consisting of an inverter 20 and an inverter 21. Thereafter, when a clocked inverter 22 is electrically connected while ZCLK="L", the latched data is output, and ZSEL0_D4 is output from an inverter 25.

As described above, a period in which ZSEL0_D4 attains "L" is shifted by one cycle from a period in which ZSEL1_D3 attains "L", that is, shifted by two cycles from a period in which ZSEL0 attains "L".

Figure 12:
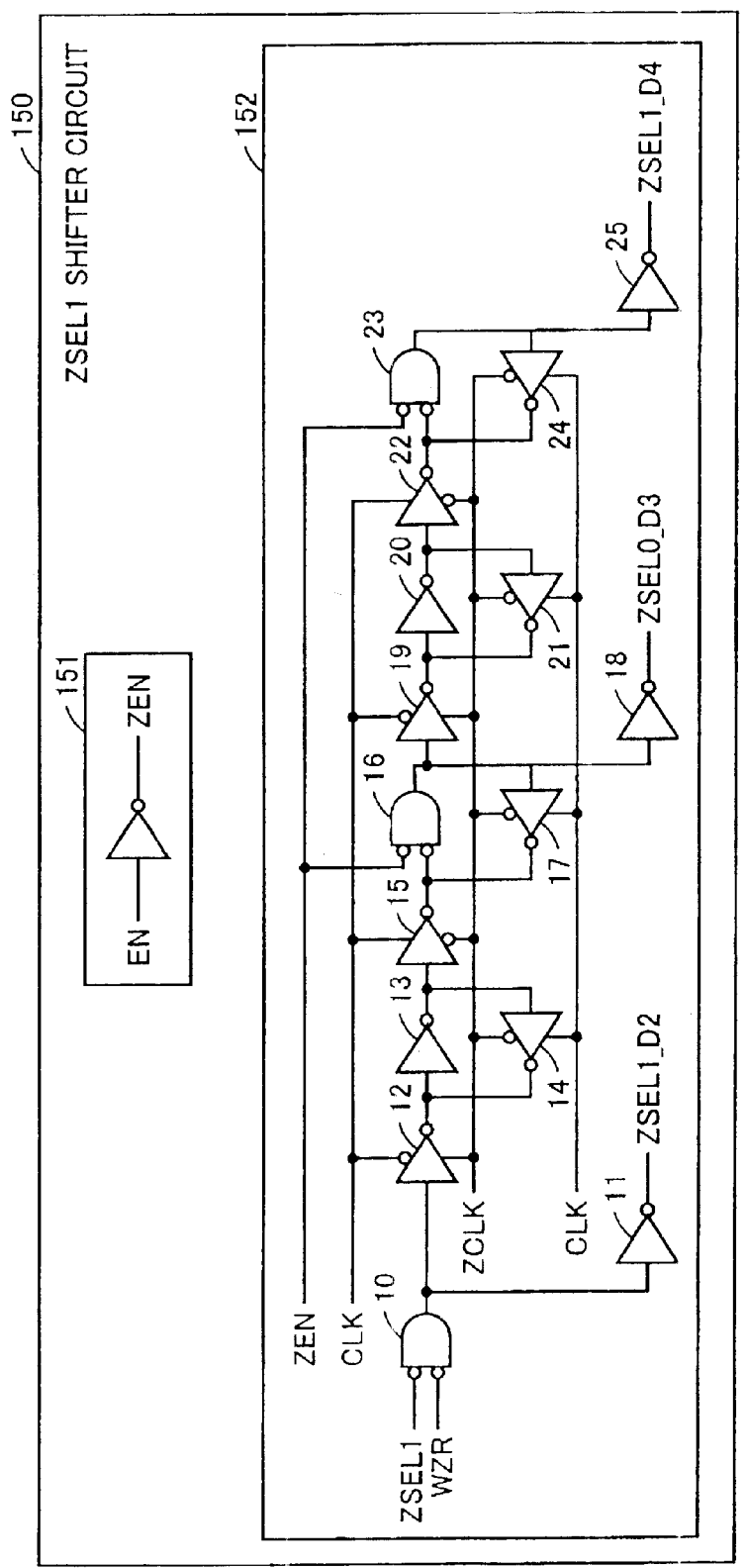
FIG. 12 shows a configuration of a ZSEL1 shifter circuit 150.

A ZSEL1 shifter circuit 150 shown in FIG. 12 is constituted with a ZEN generation circuit 151 and a shift signal generation circuit 152. An operation of each of these circuits is similar to that shown in FIG. 11.

ZSEL1 shifter circuit 150 generates ZSEL1_D2, ZSEL0_D3 and ZSEL1_D4 from ZSEL1.

During ZSEL1="L" and ZSEL1_D2="L", almost no shift occurs.

A period in which ZSEL1_D3 attains "L" is shifted by one cycle from a period in which ZSEL1 attains "L".

A period in which ZSEL1_D4 attains "L" is shifted by one cycle from a period in which ZSEL0_D3 attains "L", that is, shifted by two cycles from a period in which ZSEL1 attains "L".

(ZCLK_P#n Select Circuit)

A ZCLK_P#n select circuit selects CLK_P#K (K≧2) in a following manner.

When frequency division clock ZCLK_PD0 is specified (represented with ZSEL0="L"), ZCLK_P#n select circuit inverts with not-shown means, a clock pulse first generated after (2×Tck−Tc) period has passed since the rise of CLK#(K−2) and included in ZCLK_PDX (X=0 when K=2, X=1 when K=3, and X=0 when K=4) which is sequenced behind ZCLK_PD0 by K, to select the clock pulse as CLK_P#K (K≧2).

In other words, when K=2, an inverted signal of a clock pulse first generated after (2×Tck−Tc) period has passed since the rise of CLK#0 and included in ZCLK_PD0 is selected as CLK_P#2.

When K=3, an inverted signal of a clock pulse first generated after (2×Tck−Tc) period has passed since the rise of CLK#1 and included in ZCLK_PD1 is selected as CLK_P#3.

When K=4, an inverted signal of a clock pulse first generated after (2×Tck−Tc) period has passed since the rise of CLK#2 and included in ZCLK_PD0 is selected as CLK_P#4.

When a frequency division clock ZCLK_PD1 is specified (represented with ZSEL1="L"), the ZCLK_P#n select circuit inverts with not-shown means, a clock pulse first generated after (2×Tck−Tc) period has passed since the rise of CLK#(K−2) and included in ZCLK_PDX (X=1 when K=2, X=0 when K=3, and X=1 when K=4) sequenced behind ZCLK_PD1 by K, to select the clock pulse as CLK_P#K (K≧2).

In other words, when K=2, an inverted signal of a clock pulse first generated after (2×Tck−Tc) period has passed since the rise of CLK#0 and included in ZCLK_PD1 is selected as CLK_P#2.

When K=3, an inverted signal of a clock pulse first generated after (2×Tck−Tc) period has passed since the rise of CLK#1 and included in ZCLK_PD1 is selected as CLK_P#3.

When K=4, an inverted signal of a clock pulse first generated after (2×Tck−Tc) period has passed since the rise of CLK#2 and included in ZCLK_PD0 is selected as CLK_P#4.

Figure 13:
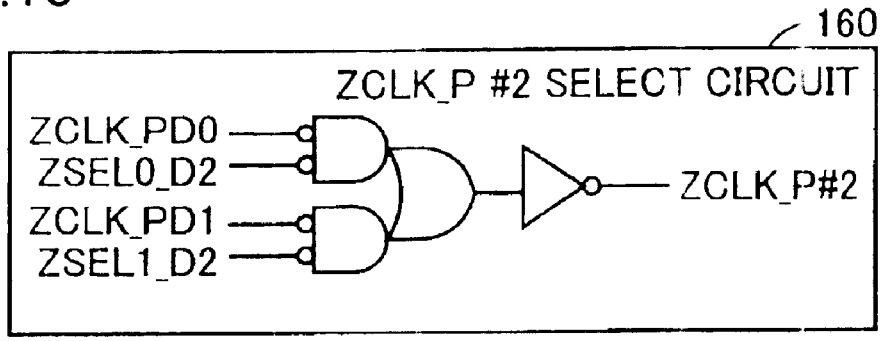
FIG. 13 shows a configuration of a ZCLK_P#2 select circuit 160.

ZCLK_P#2 select circuit 160 shown in FIG. 13 sets ZCLK_P#2 to "L", when ZCLK_PD0 attains "L" and ZSEL0_D2 attains "L". Thus, ZCLK_PD0 is selected as CLK_P#2.

In addition, ZCLK_P#2 select circuit 160 sets ZCLK_P#2 to "L", when ZCLK_PD1 attains "L" and ZSEL1_D2 attains "L". Thus, ZCLK_PD1 is selected as CLK_P#2.

Figure 14:
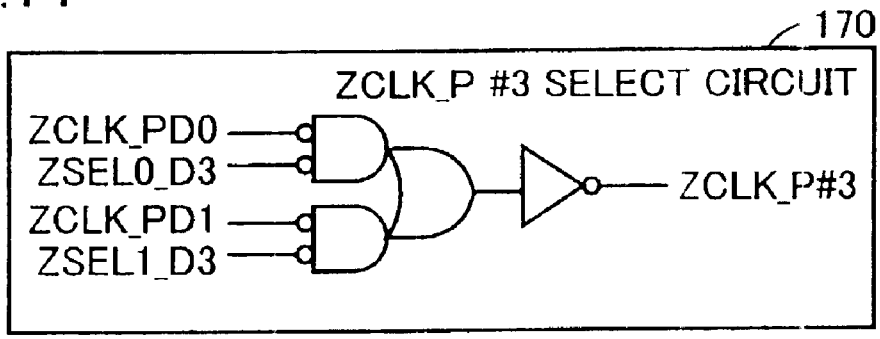
FIG. 14 shows a configuration of a ZCLK_P#3 select circuit 170.

ZCLK_P#3 select circuit 170 shown in FIG. 14 sets ZCLK_P#3 to "L", when ZCLK_PD0 attains "L" and ZSEL0_D3 attains "L". Thus, ZCLK_PD0 is selected as CLK_P#3.

In addition, ZCLK_P#3 select circuit 170 sets ZCLK_P#3 to "L", when ZCLK_PD1 attains "L" and ZSEL1_D3 attains "L". Thus, ZCLK_PD1 is selected as CLK_P#3.

Figure 15:
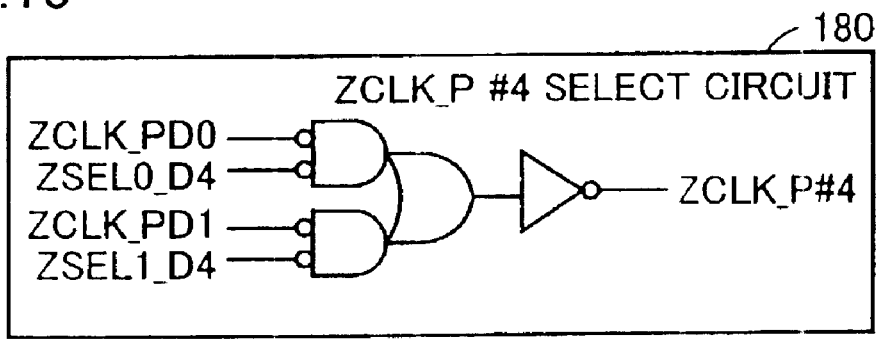
FIG. 15 shows a configuration of a ZCLK_P#4 select circuit 180.

ZCLK_P#4 select circuit 180 shown in FIG. 15 sets ZCLK_P#4 to "L", when ZCLK_PD0 attains "L" and ZSEL0_D4 attains "L". Thus, ZCLK_PD0 is selected as CLK_P#4.

In addition, ZCLK_P#4 select circuit 180 sets ZCLK_P#4 to "L", when ZCLK_PD1 attains "L" and ZSEL1_D4 attains "L". Thus, ZCLK_PD1 is selected as CLK_P#4.

ZCLK_P#n (n=2 to 4) selected as described above is used for controlling the operation of the DDR-II. That is, triggered by ZCLK_P#2="L", control signal RDT is activated. In addition, triggered by ZCLK_P#3="L" and ZCLK_P#4="L", another process step being pipelined for outputting data in the memory cell to the outside is controlled.

(CLK_P Select Operation According to the Present Embodiment)

Figure 16:
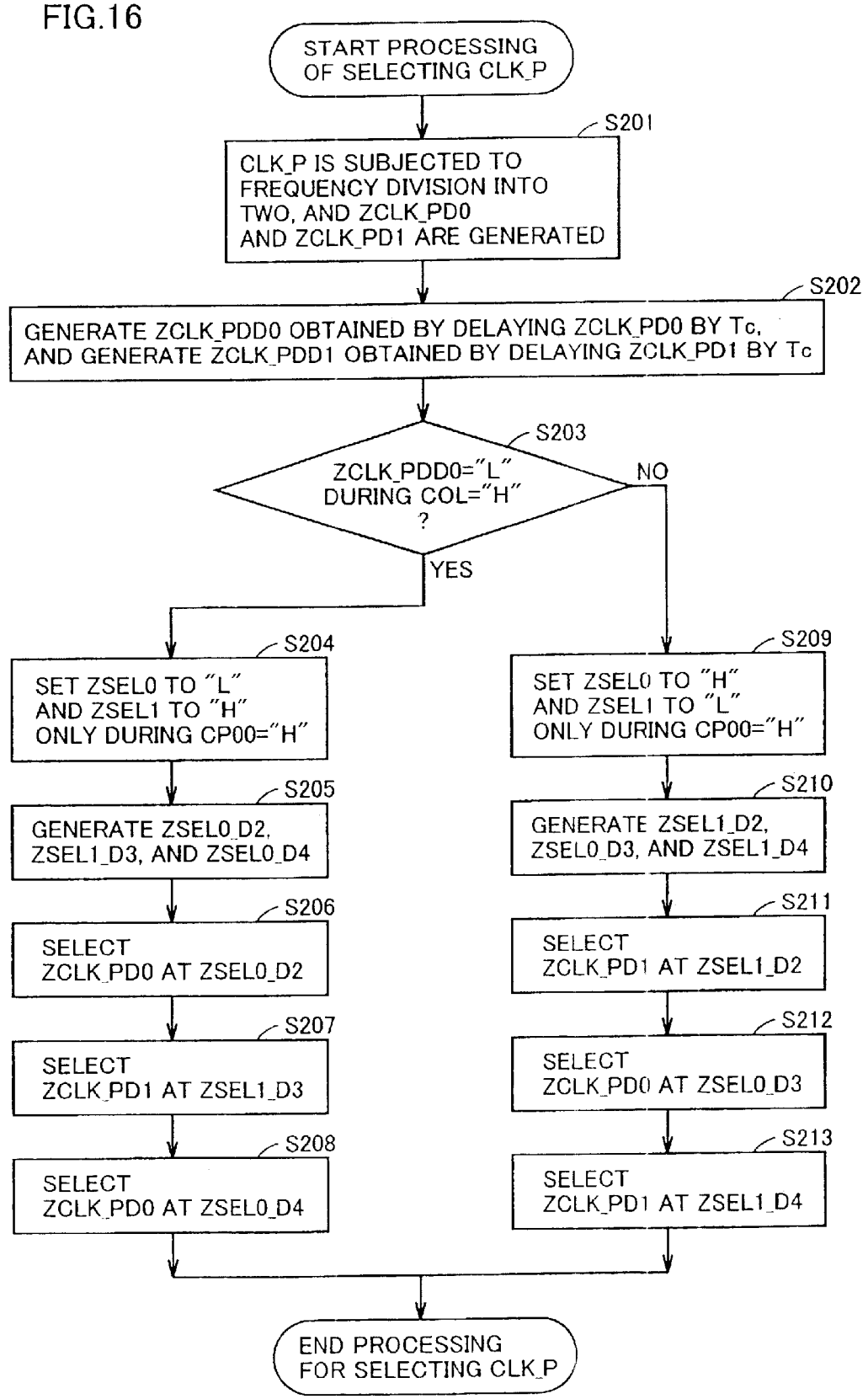
FIG. 16 is a flowchart illustrating an operation procedure in selecting CLK_P in frequency division clock select circuit 100 according to the present embodiment.
Figure 17:
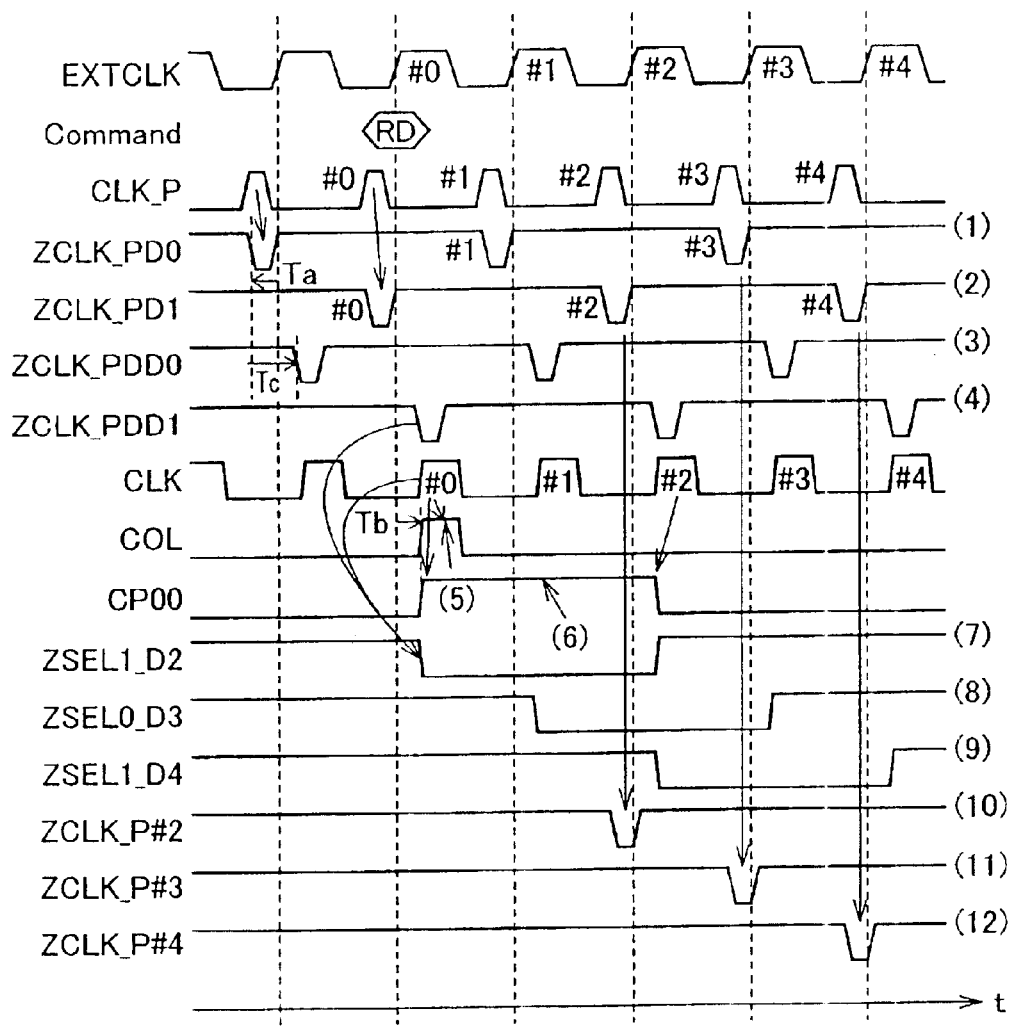
FIG. 17 shows a timing of level change of a signal involved in selecting CLK_P in frequency division clock select circuit 100.

FIG. 16 is a flowchart illustrating an operation procedure for selecting CLK_P in frequency division clock select circuit 100 according to the present embodiment. FIG. 17 shows a timing of level change of a signal involved in selecting CLK_P in frequency division clock select circuit 100. With reference to these figures, an operation for selecting CLK_P will be described.

First, frequency divider 110 divides the frequency of CLK_P into two, to generate ZCLK_PD0 and ZCLK_PD1 (shown with (1) and (2) in FIG. 17) (step S201).

Next, delay circuit 120 generates ZCLK_PDD0 obtained by delaying ZCLK_PD0 by Tc, and ZCLK_PD2 obtained by delaying ZCLK_PD1 by Tc (shown with (3) and (4) in FIG. 17) (step S202).

Next, frequency division clock select instruction circuit 130 sets ZSEL0 to "L" and ZSEL1 to "H" (step S204) only during CP00="H" (shown with (6) in FIG. 17) when ZCLK_PDD0 attains "L" during COL="H" (shown with (5) in FIG. 17) (step S203).

Next, ZSEL0 shifter circuit 140 generates ZSEL0_D2 obtained by maintaining a period of a pulse section attaining ZSEL0="L" when ZSEL0 is set to "L", generates ZSEL1_D3 obtained by shifting a pulse section attaining ZSEL0="L" by one cycle, and generates ZSEL0=D4 obtained by shifting a pulse section attaining ZSEL0="L" by 2 cycles (step S205).

Next, ZCLK_P#2 select circuit 160 uses ZSEL0_D2 to select ZCLK_PD0 when ZSEL0 is set to "L". That is, ZCLK_P#2 select circuit 160 outputs ZCLK_P#2 of L level during ZSEL0_D2="L" and ZCLK_PD0="L" (step S206).

Next, ZCLK_P#3 select circuit 170 uses ZSEL1_D3 to select ZCLK_PD1 when ZSEL0 is set to "L". That is, ZCLK_P#3 select circuit 170 outputs ZCLK_P#3 of L level during ZSEL1_D3="L" and ZCLK_PD1="L" (step S207).

Next, ZCLK_P#4 select circuit 180 uses ZSEL0_D4 to select ZCLK_PD0 when ZSEL0 is set to "L". That is, ZCLK_P#4 select circuit 180 outputs ZCLK_P#4 of L level during ZSEL0_D4="L" and ZCLK_PD0="L" (step S208).

On the other hand, frequency division clock select instruction circuit 130 sets ZSEL0 to "H" and ZSEL1 to "L" (step S209) only during CP00="H" (shown with (6) in FIG. 17) when ZCLK_PDD0 does not attain "L" during COL= "H" (shown with (5) in FIG. 17) (step S203).

Next, ZSEL1 shifter circuit 150 generates ZSEL1_D2 obtained by maintaining a period of a pulse section attaining ZSEL1="L" when ZSEL1 is set to "L", generates ZSEL0_D3 obtained by shifting a pulse section attaining ZSEL1= "L" by one cycle, and generates ZSEL1=D4 obtained by shifting a pulse section attaining ZSEL1="L" by 2 cycles (shown with (7), (8) and (9) in FIG. 17) (step S210).

Next, ZCLK_P#2 select circuit 160 uses ZSEL1_D2 to select ZCLK_PD1 (#2) when ZSEL1 is set to "L". That is, ZCLK_P#2 select circuit 160 outputs ZCLK_P#2 of L level during ZSEL1_D2="L" and ZCLK_PD1="L" (shown with (10) in FIG. 17) (step S211).

Next, ZCLK_P#3 select circuit 170 uses ZSEL0_D3 to select ZCLK_PD0 (#3) when ZSEL1 is set to "L". That is, ZCLK_P#3 select circuit 170 outputs ZCLK_P#3 of L level during ZSEL0_D3="L" and ZCLK_PD0="L" (shown with (11) in FIG. 17) (step S212).

Next, ZCLK_P#4 select circuit 180 uses ZSEL1_D4 to select ZCLK_PD1 (#4) when ZSEL1 is set to "L". That is, ZCLK_P#4 select circuit 180 outputs ZCLK_P#4 of L level during ZSEL1_D4="L" and ZCLK_PD1="L" (shown with (12) in FIG. 17) (step S213).

(Dependency on Cycle Time in Selecting CLK_P in the Present Embodiment)

The method of selecting CLK_P as described above depends on one cycle time Tck, as with the conventional method of selecting.

In the present embodiment, CP00 starts from CLK#0, and based on this, CLK_P#2 after two cycles is selected. The time difference $\Delta T$ between the timing of the rising edge of CLK#0 and the timing of the rising edge of CLK_P#2 is shown as $\Delta T=(2 \times Tck-Ta-Tb)$. In order to capture CLK_P#2 with CP00, $\Delta T$ should be larger than 0 ($\Delta T>0$). That is, $(Ta+Tb)/2$ should be smaller than Tck ($(Ta+Tb)/2<Tck$). This condition indicates that a lower limit of the cycle time can be reduced to half, compared to the conventional condition.

As described above, in a select circuit according to the present embodiment, a DLL clock corresponding to a desired EXTCLK can accurately be selected even if a cycle time is short.

(Second Embodiment)

The present embodiment relates to a frequency division clock select circuit including a delay circuit different from that in the first embodiment.

Figure 18:
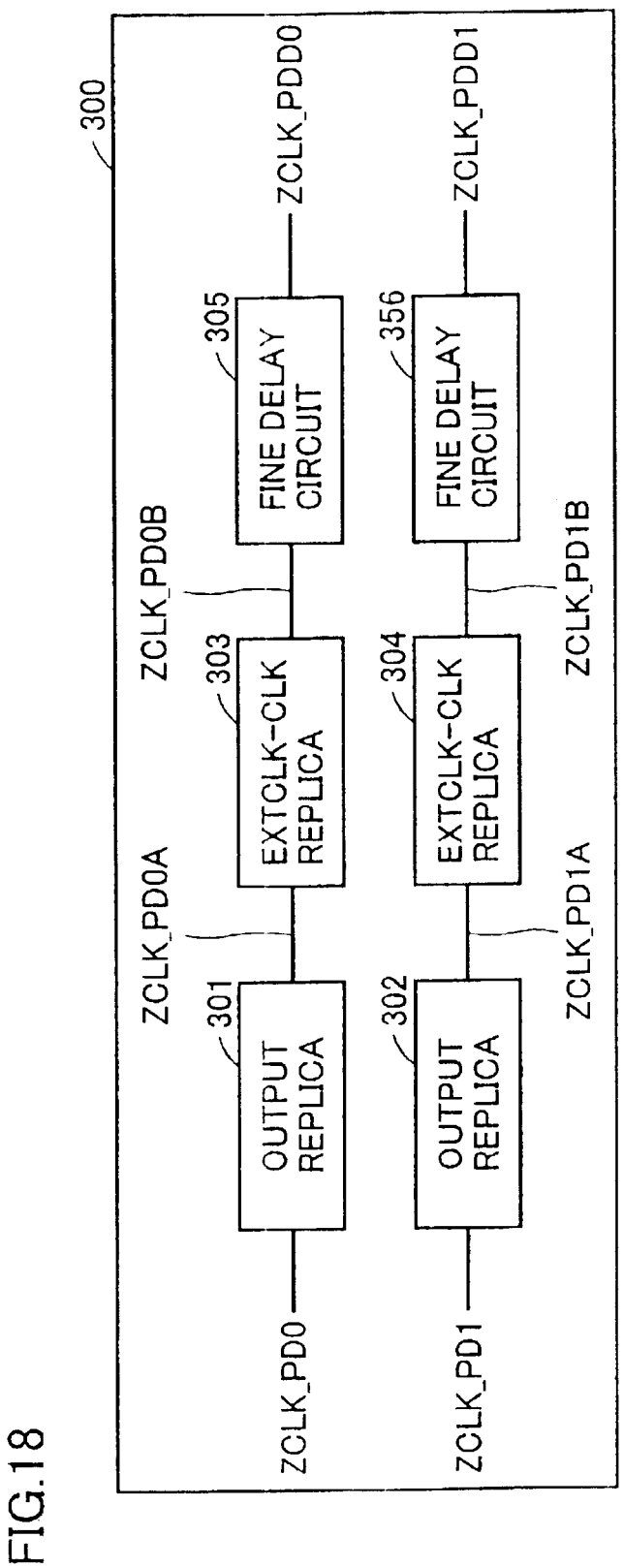
FIG. 18 shows a configuration of a delay circuit 300 according to a second embodiment of the present invention.

A delay circuit 300 shown in FIG. 18 consists of output replicas 301, 302, EXTCLK-CLK replicas 303, 304, and Fine Delay circuits 305, 356.

Output replica 301 generates ZCLK_PD0A obtained by delaying ZCLK_PD0 by Ta.

Output replica 302 generates ZCLK_PD1A obtained by delaying ZCLK_PD1 by Ta.

Output replicas 301 and 302 have a configuration identical to output replica 411 in DLL circuit 400 shown in FIG. 3.

EXTCLK-CLK replica 303 generates ZCLK_PD0B obtained by delaying ZCLK_PD0A by Tb.

EXTCLK-CLK replica 304 generates ZCLK_PD1B obtained by delaying ZCLK_PD1A by Tb.

These EXTCLK-CLK replicas 303 and 304 simulate a characteristic of a circuit generating CLK from EXTCLK, and are constituted with a logic gate having the same number of stages as a logic gate existing between EXTCLK and CLK.

Figure 19:
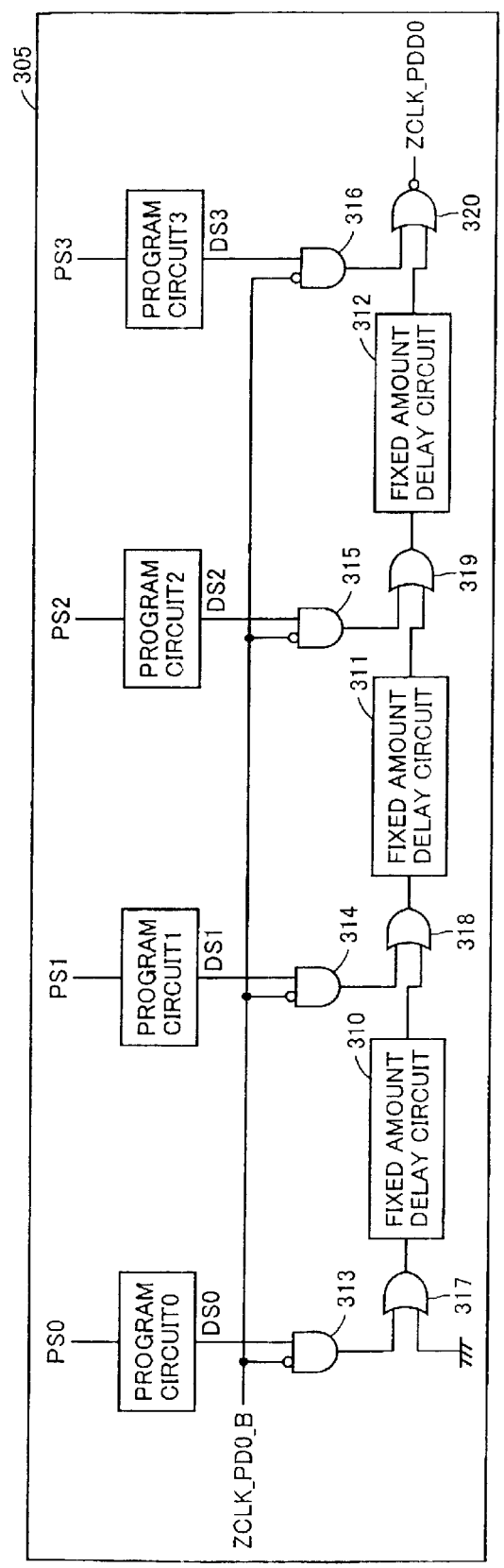
FIG. 19 shows a configuration of a Fine Delay circuit 305.

FIG. 19 shows a configuration of Fine Delay circuit 305. Fine Delay circuit 356 also has a configuration similar to this.

Fine Delay circuit 305 includes program circuits 0 to 3, fixed amount delay circuits 310 to 312, AND gates 313 to 316, and OR gates 317 to 320. Fine Delay circuit 305 has ZCLK_PD0B input, which is an output signal of EXTCLK-CLK replica 303, and outputs ZCLK_PDD0.

Program circuit 0 outputs a control signal DS0; program circuits 1 outputs a control signal DS1; program circuit 2 outputs a control signal DS2; and program circuit 3 outputs a control signal DS3. Any one of control signals DS0 to DS3 attains "H", and others are set to "L".

AND gate 313 outputs "H" only when ZCLK_PD0 attains "L" and DS0 attains "H". AND gate 314 outputs "H" only when ZCLK_PD0 attains "L" and DS1 attains "H". AND gate 315 outputs "H" only when ZCLK_PD0 attains "L" and DS2 attains "H". AND gate 316 outputs "H" only when ZCLK_PD0 attains "L" and DS3 attains "H". OR gates 317 to 319 output "H" when any input attains "H". Gate 320 outputs "L" when any input attains "H". Here, a delay amount with respect to an input signal, of an output signal at each gate is represented as Tg.

Fixed amount delay circuits 310, 311 and 312 are constituted with a plurality of delay units generating delay. Fixed amount delay circuits 310, 311 and 312 output a signal obtained by delaying an input signal by fixed delay amount Td.

As described above, when DS0 attains "H", the delay amount with respect to ZCLK_PDDB of ZCLK_PDD0 attains $3 \times Td+5 \times Tg$. When DS1 attains "H", the delay amount attains $2 \times Td+4 \times Tg$. When DS2 attains "H", the delay amount attains $1 \times Td+3 \times Tg$. When DS3 attains "H", the delay amount attains $2 \times Tg$.

Next, detailed configuration of program circuits 0 to 3 will be described.

Figure 20:
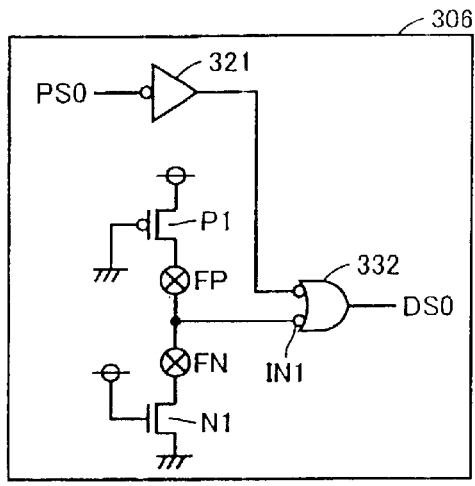
FIG. 20 shows a configuration of a program circuit 0.

FIG. 20 shows a configuration of program circuit 0. Other program circuits 1 to 3 also have similar configuration. Referring to FIG. 20, program circuit 0 includes a P-channel MOS transistor P1, an N-channel MOS transistor N1, fuses FP, FN, an NAND circuit 322, and an inverter 321.

Program circuits 0 to 3 have a test mode as an operation mode. A control signal PSn input to each program circuit n is normally set to "L" with respect to all n (=0 to 3). In the test mode, control signal PSn is set to "H" with respect to arbitrary one n, and set to "L" with respect to another n.

Conductance of P-channel MOS transistor P1 is larger than that of N-channel MOS transistor N1.

Fuses FP and FN have not been blown before the delay amount is programmed. By blowing one of the both, the delay amount is programmed. Fuse FP is blown in one program circuit among program circuits n (=0 to 3).

A control signal DSk from a program circuit k in which fuse FP has been blown attains "H", and a control signal DSm from a program circuit m in which fuse FN has been blown attains "L".

Therefore, the delay amount of ZCLK_PDD0 with respect to ZCLK_PDDB attains $3 \times Td+5 \times Tg$ when k=0, attains $2 \times Td+4 \times Tg$ when k=1, attains $1 \times Td+3 \times Tg$ when k=2, and attains $2 \times Tg$ when k=3.

Figure 21:
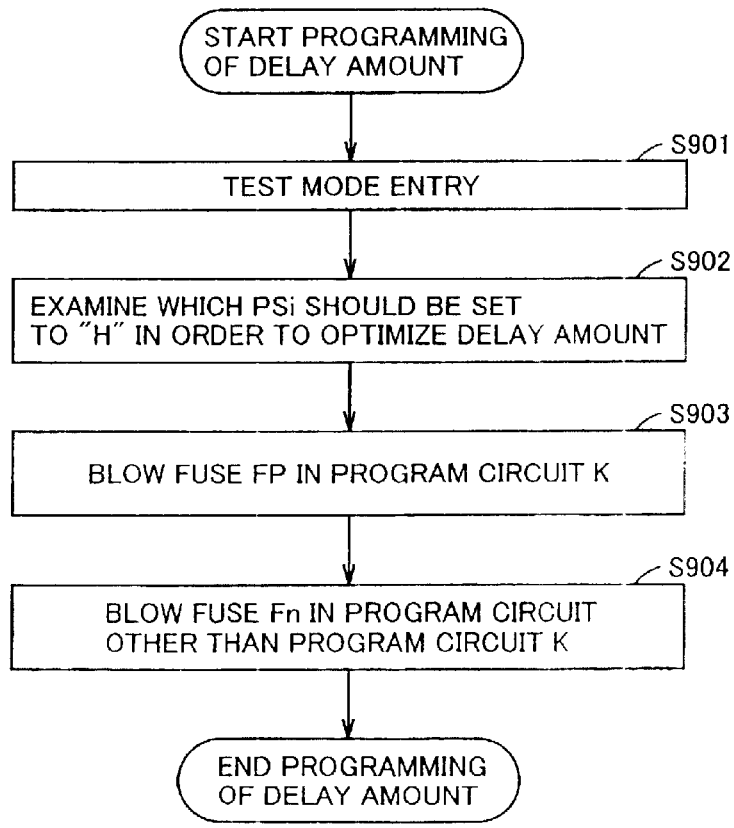
FIG. 21 is a flowchart illustrating an operation procedure for programming a delay amount by a program circuit.

Next, referring to FIG. 21, an operation for programming the delay amount by the program circuit will be described.

Initially, entry to the test mode is made. In each program circuit n, fuses FP and FN have not been blown, and conductance of P-channel MOS transistor P1 is larger than that of N-channel MOS transistor N1. Therefore, the level of an input terminal IN1 of an NAND circuit 332 attains "L".

Thus, the level of an output signal DSn of each program circuit n will be the same as that of an input signal PSn to each program circuit n (step S901).

Next, the level of an input signal PSi of one program circuit i is set to "H", and the level of an input signal PSj of another program circuit j is set to "L". Then, the delay amount of ZCLK_PDD0 with respect to ZCLK_PD0 is examined.

When an input signal PSk of a program circuit k is set to "H", it is assumed that the delay amount of ZCLK_PDD0 with respect to ZCLK_PD0 is optimized (step S902).

Next, fuse FP within program circuit k is blown, and an output signal DSk of that program circuit k is set to "H" level (step S903).

Fuse FN within program circuit m other than program circuit k is blown, and an input signal DSm of that program circuit m is set to "L" level (step S904).

As described above, according to the delay circuit in the present embodiment, the replica simulating a characteristic of an actual circuit, and the Fine Delay circuit fine-tuning the delay amount are used. Therefore, dependency of Tc on a temperature and a voltage can sufficiently be reproduced.

(Third Embodiment)

The present embodiment relates to a frequency division clock select circuit including a delay circuit different from that in the first and second embodiments. In the present embodiment, when a frequency division clock select circuit is arranged in the vicinity of the DLL circuit, an output of the output replica within the DLL circuit is used to simplify the delay circuit.

Figure 22:
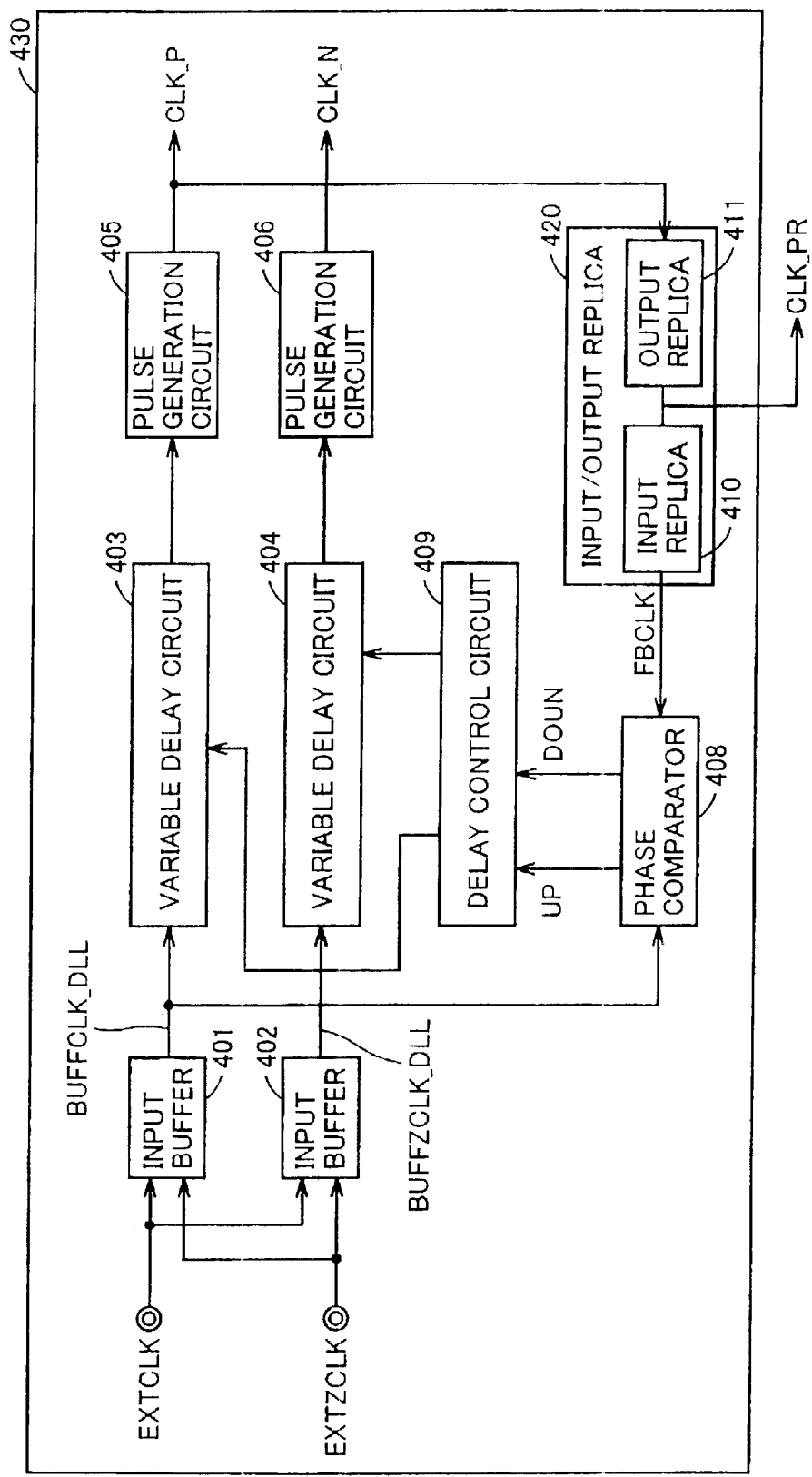
FIG. 22 shows a configuration of a DLL circuit 430 according to a third embodiment of the present invention.

FIG. 22 shows a configuration of a DLL circuit 430 according to the third embodiment. Referring to FIG. 22, CLK_PR output by output replica 411 is input to frequency divider 110 within a frequency division clock select circuit 370.

Output replica 411 reproduces, in a simulated manner, a circuit characteristic from when internal clocks CLK_P, CLK_N are output from DLL circuit 400 until when data DQ is output to the data input/output terminal, as described in the first embodiment. Therefore, CLK_PR, which is an output of output replica 411, is delayed by Ta from CLK_P.

Figure 23:
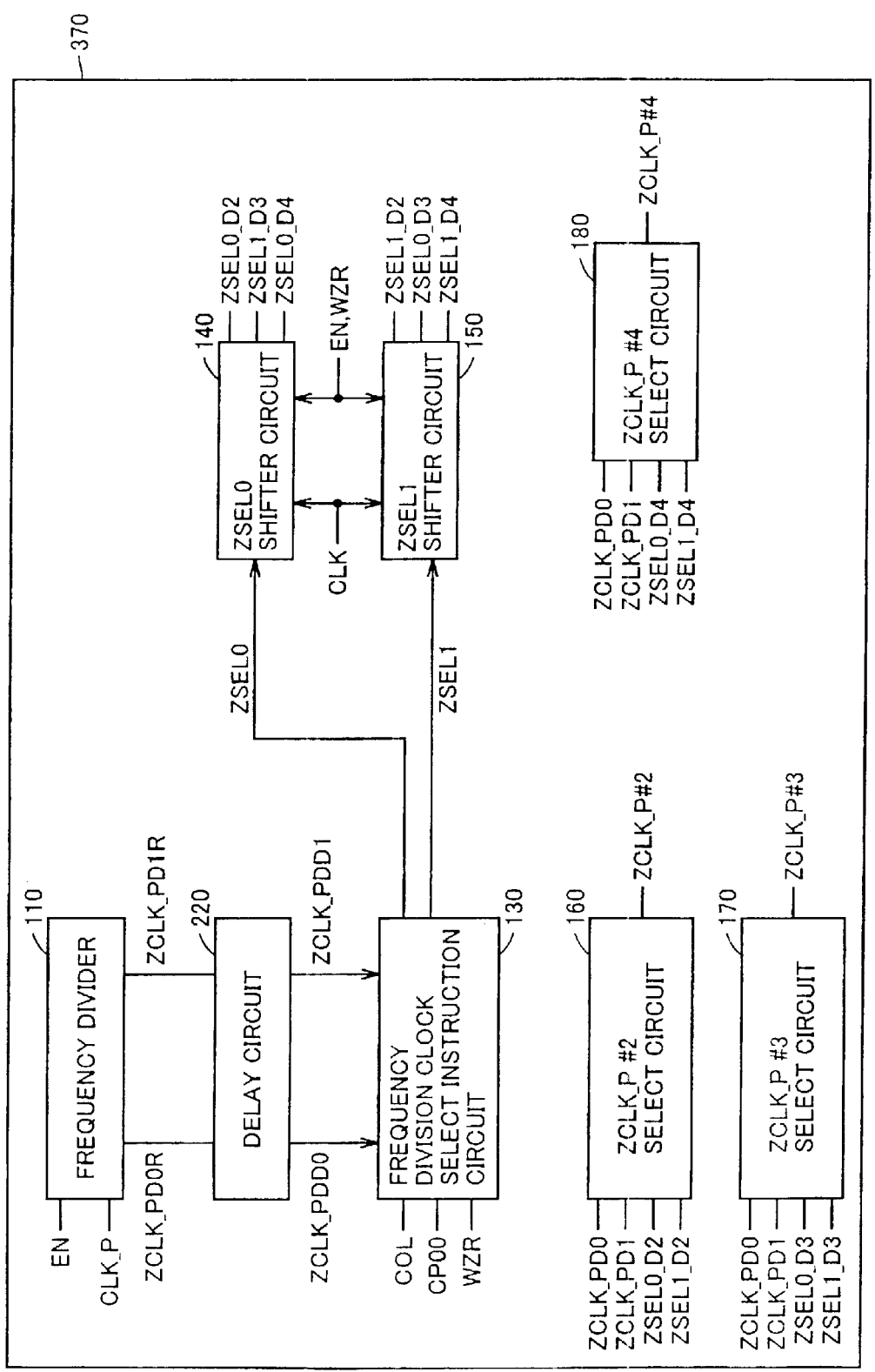
FIG. 23 shows a configuration of a frequency division clock select circuit 370 according to the third embodiment of the present invention.

FIG. 23 shows a configuration of frequency division clock select circuit 370 according to the third embodiment. Frequency 110 has CLK_PR delayed by Ta from CLK_P input, instead of CLK_P. Frequency divider 110 outputs ZCLK_PD0R and ZCLK_PD1R delayed by Ta respectively from ZCLK_PD0 and ZCLK_PD1.

Figure 24:
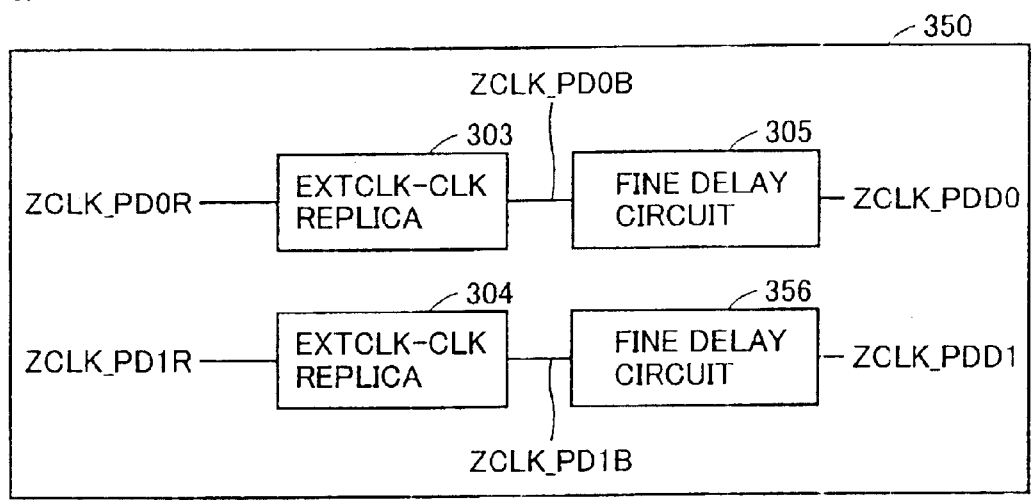
FIG. 24 shows a configuration of a delay circuit 350 according to the third embodiment of the present invention.

FIG. 24 shows a configuration of a delay circuit 350 within frequency division clock select circuit 370. Referring to FIG. 24, in delay circuit 350, output replicas 301, 302 are eliminated from delay circuit 300 in the second embodiment. This is because ZCLK_PD0R and ZCLK_PD1R delayed by Ta respectively from ZCLK_PD0 and ZCLK_PD1 are input from ZCLK_PD0 and ZCLK_PD1.

As described above, according to the delay circuit of the present embodiment, the output of the output replica within the DLL circuit is provided as an input of the frequency division clock select circuit. Therefore, it is not necessary to provide a replica having the same configuration as the output replica within the delay circuit, and the configuration of the delay circuit can be simplified.

(Variation)

The present invention is not limited to the embodiments described above, but naturally encompasses a variation in the following.

(1) In the first to third embodiments, though frequency division into two halves has been described, frequency division into N is possible.

That is, the frequency divider divides the DLL clock into N, and outputs cyclically sequenced N frequency division clocks ZCLK_PD0, ZCLK_PD1, . . . ZCLK_PD(N-1). These frequency division clocks are cyclically sequenced. In other words, the frequency division clocks are sequenced in the order of ZCLK_PD0→ZCLK_PD1→ZCLK_PD2 . . . →ZCLK_PD(N-1)→ZCLK_PD0→ZCLK_PD1→ . . .

The delay circuit delays N frequency division clocks ZCLK_PD0, ZCLK_PD1, . . . ZCLK_PD(N-1) by Tc, and outputs N delay frequency division clocks ZCLK_PDD0, ZCLK_PDD1, . . . ZCLK_PDD(N-1).

The frequency division clock select instruction circuit specifies a frequency division clock to which the clock pulse having a phase difference of Tc from CLK#0 belongs, out of N frequency division clocks ZCLK_PD0, ZCLK_PD1, . . . ZCLK_PD(N-1).

Specifically, the frequency division clock select instruction circuit specifies a delay frequency division clock including a clock pulse in a period during which CLK#0 is generated, out of N delay frequency division clocks ZCLK_PDD0, ZCLK_PDD1, . . . ZCLK_PDD(N-1), and specifies a frequency division clock corresponding to that delay frequency division clock.

The ZSELn shifter circuit generates control signal ZSEL serving as a pulse for a period of N×Tck from the rising edge of CLK# (K-N).

The ZCLK_P#n select circuit selects as CLK_P#K, a clock pulse first generated after a period of (N×Tck-Tc) has passed since the rising of CLK# (K-N) and included in a frequency division clock of a sequence behind the specified frequency division clock by K (≧N).

Specifically, the ZCLK_P#n select circuit includes a logic circuit. The logic circuit has control signal ZSEL and the frequency division clock of a sequence behind the specified frequency division clock by K (≧N) input, and outputs a clock pulse selected as CLK_P#K.

When an example is expanded to frequency division into N, a condition of (Ta+Tb)/N<Tck should be satisfied. This condition indicates that the lower limit of the cycle time can be reduced to 1/N, compared to the conventional condition.

(2) In the first to third embodiments, though the delay circuit has been described as delaying an input signal by Tc, there may be a case in which the signal cannot exactly be delayed by Tc. Even in such a case, by moving ahead the start timing of the pulse of COL or CP00, or by increasing a pulse width, ZCLK_PDD0, ZCLK_PD1 can reliably be captured.

(3) In the present embodiment, though a configuration and a method for selecting CLK_P have been described, it is also possible to select CLK_N with a similar configuration and method.

(4) In the present embodiment, though ZSEL0_D2 (or ZSEL1_D2) has been generated from ZSEL0 (or ZSEL1) in order to select CLK_P#2, ZSEL0 (or ZSEL1) may directly be used to select CLK_P#2.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device inputting/outputting data in synchronization with a rise and a fall of an external clock, comprising:

a first internal clock generation circuit generating a first internal clock having a constant delay amount with respect to the external clock having a cycle T;

a second internal clock generation circuit generating a second internal clock having a constant backward amount with respect to said external clock, in order to synchronize an output timing of the data to outside with said external clock;

a frequency divider dividing a frequency of said second internal clock into N ($\geq 2$) to output cyclically sequenced N frequency division clocks;

a first circuit specifying a frequency division clock including a second internal clock pulse having a constant phase difference from a first internal clock pulse corresponding to an external clock pulse indicating a timing of input of a read command, among said N frequency division clocks; and a second circuit selecting the second internal clock pulse corresponding to each external clock pulse after the input of the read command, when said specified frequency division clock is regarded as a starting point.

2. The semiconductor memory device according to claim 1, wherein said first internal clock generation circuit generates a first internal clock having a first value for a delay amount with respect to said external clock, said second internal clock generation circuit generates said second internal clock having a second value for a backward amount with respect to said external clock, said first circuit specifies said frequency division clock, the frequency division clock including said second internal clock pulse having a phase difference from a 0th, said first clock pulse corresponding to a 0th external clock pulse indicating a timing of input of the read command, by a sum of a first value and a second value, and said second circuit selects as said second internal clock pulse corresponding to a Kth external clock pulse, a clock pulse first generated after a period of (N×T−a third value) has passed since a (K−N)th first internal clock pulse and included in a frequency division clock following after said specified frequency division clock by K ($\geq N$).

3. The semiconductor memory device according to claim 2, wherein said first circuit includes a delay circuit delaying each of said N frequency division clocks by a prescribed amount, to output N delay frequency division clocks, and a circuit specifying a delay frequency division clock including a clock pulse in a period during which said 0th, first internal clock pulse is generated, among said N delay frequency division clocks.

4. The semiconductor memory device according to claim 3, wherein said second circuit includes a circuit generating a signal serving as a pulse for a period of N×T from a beginning edge of said (K−N)th first internal clock pulse, and a logic circuit having said generated signal and the frequency division clock of a sequence behind said specified frequency division clock by K ($\geq N$) input, and outputting a clock pulse selected as said second internal clock pulse.

5. The semiconductor memory device according to claim 3, wherein said delay circuit includes a first replica reproducing, in a simulated manner, a circuit characteristic serving for a processing from when said second internal clock pulse is output from said second internal clock generation circuit until when data is finally output from a data input/output terminal with the second internal clock pulse serving as trigger, a second replica simulating a circuit characteristic serving for generation of said first internal clock from an external clock in said first internal clock generation circuit, and an adjustment circuit into which a variable amount of delay is programmed, and said frequency division clock is delayed via said first replica, said second replica and said adjustment circuit.

6. The semiconductor memory device according to claim 5, wherein said adjustment circuit includes a plurality of program circuits, and a plurality of delay elements provided in a plurality of paths between an input and an output, each program circuit includes a first fuse and a second fuse, each program circuit outputs a first logic value or a second logic value in accordance with a logic value of an input signal to said each program circuit before fuse blow, each program circuit outputs the first logic value with blow of a first fuse, and outputs a second logic value with blow of a second fuse, and a path between the input and the output is determined in accordance with an output value of said each program circuit.

7. The semiconductor memory device according to claim 3, wherein said second internal clock generation circuit includes a first replica reproducing, in a simulated manner, a circuit characteristic serving for a processing from when said second internal clock pulse is output from said second internal clock generation circuit until when the data is finally output from the data input/output terminal with the second internal clock pulse serving as trigger, said frequency divider divides a frequency of an output signal of said first replica into N, instead of said second internal clock, said delay circuit includes a second replica simulating a circuit characteristic serving for a processing for generating said first internal clock from an external clock in said first internal clock generation circuit, and an adjustment circuit into which a variable amount of delay is programmed, and said frequency division clock is delayed via said second replica and said adjustment circuit.

* * * * *